(12) United States Patent
Chen et al.

(10) Patent No.: US 11,979,002 B2
(45) Date of Patent: May 7, 2024

(54) DIODE LASER APPARATUS WITH FAC LENS OUT-OF-PLANE BEAM STEERING

(71) Applicant: nLIGHT, Inc., Vancouver, WA (US)

(72) Inventors: Zhigang Chen, Portland, OR (US); Manoj Kanskar, Portland, OR (US); Shuang Li, Vancouver, WA (US); Jim Zhang, Vancouver, WA (US); Mark DeFranza, Vancouver, WA (US); David Martin Hemenway, Beaverton, OR (US); Eric Martin, Vancouver, WA (US); Jay Small, Vancouver, WA (US)

(73) Assignee: nLIGHT, Inc., Camas, WA (US)

( * ) Notice: Subject to any disclaimer, the term of this patent is extended or adjusted under 35 U.S.C. 154(b) by 86 days.

(21) Appl. No.: 17/093,111

(22) Filed: Nov. 9, 2020

(65) Prior Publication Data

US 2021/0126435 A1    Apr. 29, 2021

Related U.S. Application Data

(63) Continuation of application No. 16/269,387, filed on Feb. 6, 2019, now Pat. No. 10,833,482.
(Continued)

(51) Int. Cl.
*H01S 5/40* (2006.01)
*G02B 6/42* (2006.01)
*H01S 5/02251* (2021.01)

(52) U.S. Cl.
CPC .......... *H01S 5/4075* (2013.01); *G02B 6/4296* (2013.01); *H01S 5/02251* (2021.01)

(58) Field of Classification Search
CPC .... H01S 5/4025; H01S 5/4012; H01S 5/4075; H01S 5/4296; G02B 6/4296; G02B 19/0057
See application file for complete search history.

(56) References Cited

U.S. PATENT DOCUMENTS 3,410,630 A    11/1968    Jacobs
3,622,906 A    11/1971    Nyul
(Continued)

FOREIGN PATENT DOCUMENTS

CN    1829015    9/2006
CN    1975507    6/2007
(Continued)

OTHER PUBLICATIONS

Edwin, "Stripe Stacker for Use with Laser Diode Bars," Optics Letters, 20:222-224 (Jan. 15, 1995).
(Continued)

*Primary Examiner* — Xinning(Tom) Niu
*Assistant Examiner* — Delma R Fordé
(74) *Attorney, Agent, or Firm* — WILEY REIN LLP

(57) ABSTRACT

Apparatus include a first laser diode situated to emit a beam from an exit facet along an optical axis, the beam as emitted having perpendicular fast and slow axes perpendicular to the optical axis, a first fast axis collimator (FAC) optically coupled to the beam as emitted from the exit facet and configured to direct the beam along a redirected beam axis having a non-zero angle with respect to the optical axis of the first laser diode, a second laser diode situated to emit a beam from an exit facet of the second laser diode along an optical axis parallel to the optical axis of the first laser diode and with a slow axis in a common plane with the slow axis of the first laser diode, and a second fast axis collimator (FAC) optically coupled to the beam as emitted from the exit facet of the second laser diode and configured to direct the beam along a redirected beam axis having a non-zero angle with respect to the optical axis of the second laser diode.

21 Claims, 18 Drawing Sheets

Related U.S. Application Data

(60) Provisional application No. 62/650,907, filed on Mar. 30, 2018, provisional application No. 62/627,165, filed on Feb. 6, 2018.

(56) References Cited

U.S. PATENT DOCUMENTS

| | | | |
|---|---|---|---|
| 3,827,059 A | 7/1974 | Rambauske | |
| 4,151,582 A | 4/1979 | Grunberger | |
| 4,550,333 A | 10/1985 | Ridder et al. | |
| 4,609,262 A | 9/1986 | Fujikawa et al. | |
| 4,689,482 A | 8/1987 | Horikawa et al. | |
| 4,716,568 A | 12/1987 | Scifres et al. | |
| 4,719,631 A | 1/1988 | Conaway | |
| 4,828,357 A | 5/1989 | Arata et al. | |
| 5,048,911 A | 9/1991 | Sang et al. | |
| 5,077,750 A | 12/1991 | Pocholle et al. | |
| 5,105,430 A | 4/1992 | Mundinger et al. | |
| 5,168,401 A | 12/1992 | Endriz | |
| 5,251,060 A | 10/1993 | Uenishi et al. | |
| 5,305,344 A | 4/1994 | Patel | |
| 5,319,528 A | 6/1994 | Raven | |
| 5,438,208 A * | 8/1995 | Takemoto | H01S 5/0264 257/82 |
| 5,515,391 A | 5/1996 | Endriz | |
| 5,610,930 A | 3/1997 | Macomber et al. | |
| 5,668,822 A | 9/1997 | Tada | |
| 5,764,675 A | 6/1998 | Juhala | |
| 5,825,551 A | 10/1998 | Clarkson et al. | |
| 5,828,683 A | 10/1998 | Freitas | |
| 5,887,096 A | 3/1999 | Du et al. | |
| 5,898,211 A | 4/1999 | Marshall et al. | |
| 5,909,458 A | 6/1999 | Freitas et al. | |
| 5,986,794 A | 11/1999 | Krause et al. | |
| 5,987,043 A | 11/1999 | Brown et al. | |
| 6,028,722 A | 2/2000 | Lang | |
| 6,041,072 A | 3/2000 | Ventrudo et al. | |
| 6,044,096 A | 3/2000 | Wolak et al. | |
| 6,057,871 A | 5/2000 | Peterson | |
| 6,075,912 A | 6/2000 | Goodman | |
| 6,115,185 A | 9/2000 | Du et al. | |
| 6,124,973 A | 9/2000 | Du et al. | |
| 6,212,310 B1 | 4/2001 | Waarts et al. | |
| 6,229,831 B1 | 5/2001 | Nightingale et al. | |
| 6,240,116 B1 | 5/2001 | Lang et al. | |
| 6,266,359 B1 | 7/2001 | Taheri et al. | |
| 6,324,320 B1 | 11/2001 | Goodman | |
| 6,327,285 B1 | 12/2001 | Wang | |
| 6,377,410 B1 | 4/2002 | Wang et al. | |
| 6,440,778 B1 | 8/2002 | Okada et al. | |
| 6,462,883 B1 | 10/2002 | Wang et al. | |
| 6,552,853 B2 | 4/2003 | Goodman | |
| 6,556,352 B2 | 4/2003 | Wang et al. | |
| 6,636,538 B1 | 10/2003 | Stephens | |
| 6,673,699 B2 | 1/2004 | Hubbard et al. | |
| 6,680,800 B1 | 1/2004 | Schreiber et al. | |
| 6,683,727 B1 | 1/2004 | Goring et al. | |
| 6,700,709 B1 | 3/2004 | Fermann | |
| 6,710,926 B2 | 3/2004 | Beach et al. | |
| 6,744,805 B2 | 6/2004 | Wang et al. | |
| 6,765,725 B1 | 7/2004 | Fermann et al. | |
| 6,778,732 B1 | 8/2004 | Fermann | |
| 6,898,222 B2 | 5/2005 | Hennig et al. | |
| 6,903,863 B1 | 6/2005 | Carniel et al. | |
| 6,972,827 B2 | 12/2005 | Mi | |
| 6,975,659 B2 | 12/2005 | Nagano et al. | |
| 7,420,996 B2 | 9/2008 | Schulte et al. | |
| 7,436,868 B2 | 10/2008 | Schulte et al. | |
| 7,443,895 B2 | 10/2008 | Schulte et al. | |
| 7,537,395 B2 | 5/2009 | Savage-Leuchs | |
| 7,586,963 B2 | 9/2009 | Schulte et al. | |
| 7,733,932 B2 | 6/2010 | Faybishenko | |
| 7,751,458 B2 | 7/2010 | Regaard et al. | |
| 7,764,723 B2 | 7/2010 | Ovtchinnikov et al. | |
| 7,817,361 B2 | 10/2010 | Mimura et al. | |
| 7,830,608 B2 | 11/2010 | Hu | |
| 7,848,372 B2 | 12/2010 | Schulte et al. | |
| 7,947,517 B2 | 5/2011 | Hisa | |
| 8,000,360 B2 | 8/2011 | Faybishenko | |
| 8,066,389 B2 | 11/2011 | Silverstein et al. | |
| 8,126,028 B2 | 2/2012 | Clifford, Jr. | |
| 8,339,598 B2 | 12/2012 | Ban et al. | |
| 8,427,749 B2 | 4/2013 | Du et al. | |
| 8,432,945 B2 | 4/2013 | Faybishenko | |
| 8,437,086 B2 | 5/2013 | Du et al. | |
| 8,488,245 B1 | 7/2013 | Chann | |
| 8,508,729 B2 | 8/2013 | Ban et al. | |
| 8,553,221 B2 | 10/2013 | Volodin et al. | |
| 8,599,485 B1 | 12/2013 | Cobb | |
| 8,654,326 B2 | 2/2014 | Volodin et al. | |
| 8,711,894 B2 | 4/2014 | Chuyanov et al. | |
| 8,830,587 B2 | 9/2014 | Bhatia et al. | |
| 8,842,369 B2 | 9/2014 | Li | |
| 8,861,082 B2 | 10/2014 | Cobb | |
| 8,873,134 B2 | 10/2014 | Price et al. | |
| 8,891,579 B1 | 11/2014 | Price et al. | |
| 8,942,521 B2 | 1/2015 | Song et al. | |
| 9,005,262 B2 | 4/2015 | Liu et al. | |
| 9,373,932 B2 | 6/2016 | Hayamizu et al. | |
| 9,413,136 B1 | 8/2016 | Vethake et al. | |
| 9,455,552 B1 * | 9/2016 | Price | H01S 5/4075 |
| 9,705,289 B2 | 7/2017 | Kanskar et al. | |
| 9,720,145 B2 | 8/2017 | Kanskar | |
| 10,153,608 B2 | 12/2018 | Hemenway et al. | |
| 10,283,939 B2 | 5/2019 | Dawson et al. | |
| 10,651,355 B1 * | 5/2020 | Hemenway | H01S 5/2036 |
| 10,761,276 B2 | 9/2020 | Hemenway et al. | |
| 2004/0114027 A1 | 6/2004 | Frith | |
| 2004/0252388 A1 | 12/2004 | Yamanaka et al. | |
| 2006/0165144 A1 | 7/2006 | Mikhailov et al. | |
| 2006/0280209 A1 | 12/2006 | Treusch | |
| 2007/0047401 A1 | 3/2007 | Sun | |
| 2007/0116071 A1 | 5/2007 | Schulte et al. | |
| 2007/0116077 A1 | 5/2007 | Farmer et al. | |
| 2007/0217467 A1 | 9/2007 | DeFranza et al. | |
| 2007/0217468 A1 | 9/2007 | DeFranza et al. | |
| 2007/0217469 A1 | 9/2007 | DeFranza et al. | |
| 2007/0217470 A1 | 9/2007 | DeFranza et al. | |
| 2007/0217471 A1 | 9/2007 | DeFranza et al. | |
| 2007/0236781 A1 | 10/2007 | Fidric | |
| 2007/0268572 A1 | 11/2007 | Hu | |
| 2007/0268945 A1 | 11/2007 | Schulte et al. | |
| 2007/0268946 A1 | 11/2007 | Schulte et al. | |
| 2007/0268947 A1 | 11/2007 | Schulte et al. | |
| 2008/0019010 A1 | 1/2008 | Govorkov et al. | |
| 2008/0080572 A1 | 4/2008 | Kamijima | |
| 2008/0210671 A1 | 9/2008 | Jennings et al. | |
| 2009/0129420 A1 * | 5/2009 | Regaard | H01S 5/405 372/50.12 |
| 2009/0152247 A1 | 6/2009 | Jennings et al. | |
| 2009/0323752 A1 * | 12/2009 | Chuyanov | G02B 19/0052 372/50.23 |
| 2010/0158060 A1 | 6/2010 | Faybishenko | |
| 2010/0226233 A1 * | 9/2010 | Tanabe | G11B 7/1362 |
| 2010/0226405 A1 | 9/2010 | Chuyanov et al. | |
| 2010/0303110 A1 | 12/2010 | Venkata et al. | |
| 2010/0328633 A1 * | 12/2010 | Sato | G02B 19/0066 362/235 |
| 2012/0177074 A1 | 7/2012 | Liu et al. | |
| 2013/0146253 A1 | 6/2013 | Daly | |
| 2013/0148684 A1 | 6/2013 | Guo et al. | |
| 2013/0162956 A1 | 6/2013 | Okuda | |
| 2013/0194801 A1 | 8/2013 | Wolf et al. | |
| 2013/0215924 A1 | 8/2013 | Brennan et al. | |
| 2014/0036375 A1 | 2/2014 | Chann et al. | |
| 2014/0098534 A1 | 4/2014 | Jackson | |
| 2014/0236022 A1 | 8/2014 | Zeng et al. | |
| 2014/0300971 A1 | 10/2014 | Wolak et al. | |
| 2015/0003484 A1 | 1/2015 | Muendel | |
| 2015/0055667 A1 | 2/2015 | Horn et al. | |
| 2015/0131692 A1 | 5/2015 | Hayamizu et al. | |
| 2015/0280404 A1 | 10/2015 | Kasai et al. | |
| 2015/0295386 A1 * | 10/2015 | Hemenway | H01S 5/4012 372/46.01 |

(56) References Cited

U.S. PATENT DOCUMENTS

| | | | |
|---|---|---|---|
| 2015/0349481 A1 | 12/2015 | Kliner | |
| 2016/0147025 A1 | 5/2016 | Sakamoto | |
| 2016/0181764 A1 | 6/2016 | Kanskar et al. | |
| 2016/0322777 A1 | 11/2016 | Zediker et al. | |
| 2017/0212355 A1 | 7/2017 | Chryssis et al. | |
| 2017/0271837 A1 | 9/2017 | Hemenway et al. | |
| 2018/0031850 A1* | 2/2018 | Jiang | H01S 5/0071 |
| 2018/0183214 A1 | 6/2018 | Dawson et al. | |
| 2018/0309264 A1 | 10/2018 | Kanskar et al. | |
| 2019/0212497 A1 | 7/2019 | Hemenway et al. | |
| 2019/0221990 A1 | 7/2019 | Hemenway et al. | |
| 2019/0252863 A1 | 8/2019 | Chen et al. | |
| 2023/0012623 A1* | 1/2023 | Zhou | H01S 5/0264 |

FOREIGN PATENT DOCUMENTS

| | | | |
|---|---|---|---|
| CN | 101141051 | 3/2008 | |
| CN | 101144909 | 3/2008 | |
| CN | 101154011 | 4/2008 | |
| CN | 201113224 | 9/2008 | |
| CN | 101707326 | 5/2010 | |
| CN | 201515142 | 6/2010 | |
| CN | 102052608 | 5/2011 | |
| CN | 102074896 | 5/2011 | |
| CN | 102089943 | 6/2011 | |
| CN | 102437509 | 5/2012 | |
| CN | 202548385 | 11/2012 | |
| CN | 202720390 | 2/2013 | |
| CN | 203071399 | 7/2013 | |
| CN | 103368066 | 10/2013 | |
| CN | 103401136 | 11/2013 | |
| CN | 204992245 U | 1/2016 | |
| EP | 0721113 | 7/1996 | |
| JP | 2001-264590 | 9/2001 | |
| JP | 2008-109083 | 5/2008 | |
| JP | 4648107 | 12/2010 | |
| JP | 2014-126852 | 7/2014 | |
| JP | 2016-099573 | 5/2016 | |
| JP | 2016-518726 | 6/2016 | |
| JP | 2016-143704 | 8/2016 | |
| KR | 20170059171 | * 5/2017 | H01S 5/02252 |
| RU | 2010143026 | 4/2012 | |
| WO | WO 2005059626 | 6/2005 | |
| WO | WO2009/079567 | 10/2009 | |
| WO | WO 2009/151558 | 12/2009 | |
| WO | WO 2018/119125 | 6/2018 | |

OTHER PUBLICATIONS

International Search Report and Written Opinion for International Application No. PCT/US2015/019288, dated Jun. 10, 2015.
International Search Report and Written Opinion from International Application No. PCT/US2017/018210, dated May 8, 2017, 12 pages.
International Search Report and Written Opinion for related International Application No. PCT/US2017/023067, 12 pages, dated Jun. 27, 2017.
International Search Report and Written Opinion for related International Application No. PCT/US2018/029222, 6 pages, dated Aug. 9, 2018.
International Preliminary Report on Patentability from International Application No. PCT/US2017/018210, dated Aug. 21, 2018, 8 pages.
International Search Report and Written Opinion for related International Application No. PCT/US2019/016906, 6 pages, dated Jul. 4, 2019.
Lens Cell, Crossed Cylinders, Pearl Drawing, 1 page (Feb. 22, 2007).
Office Action for related CN App. No. 201980023147.3 (w/ Eng. translation) dated Sep. 12, 2023, 24 pages.
Office Action for related EP App. No. 19751579.4, dated Sep. 18, 2023, 25 pages.

* cited by examiner

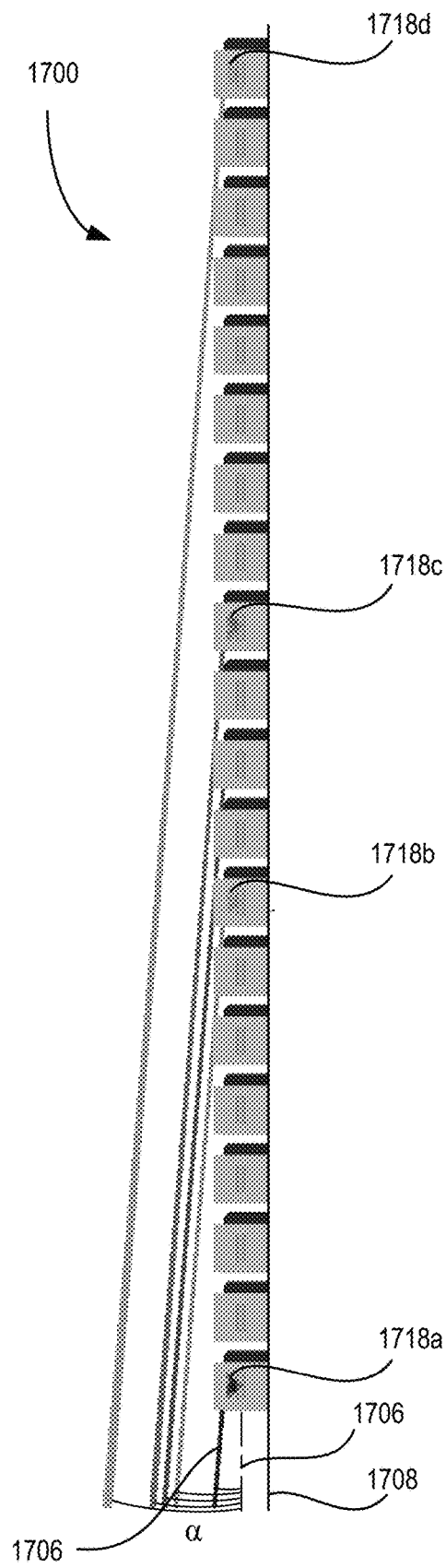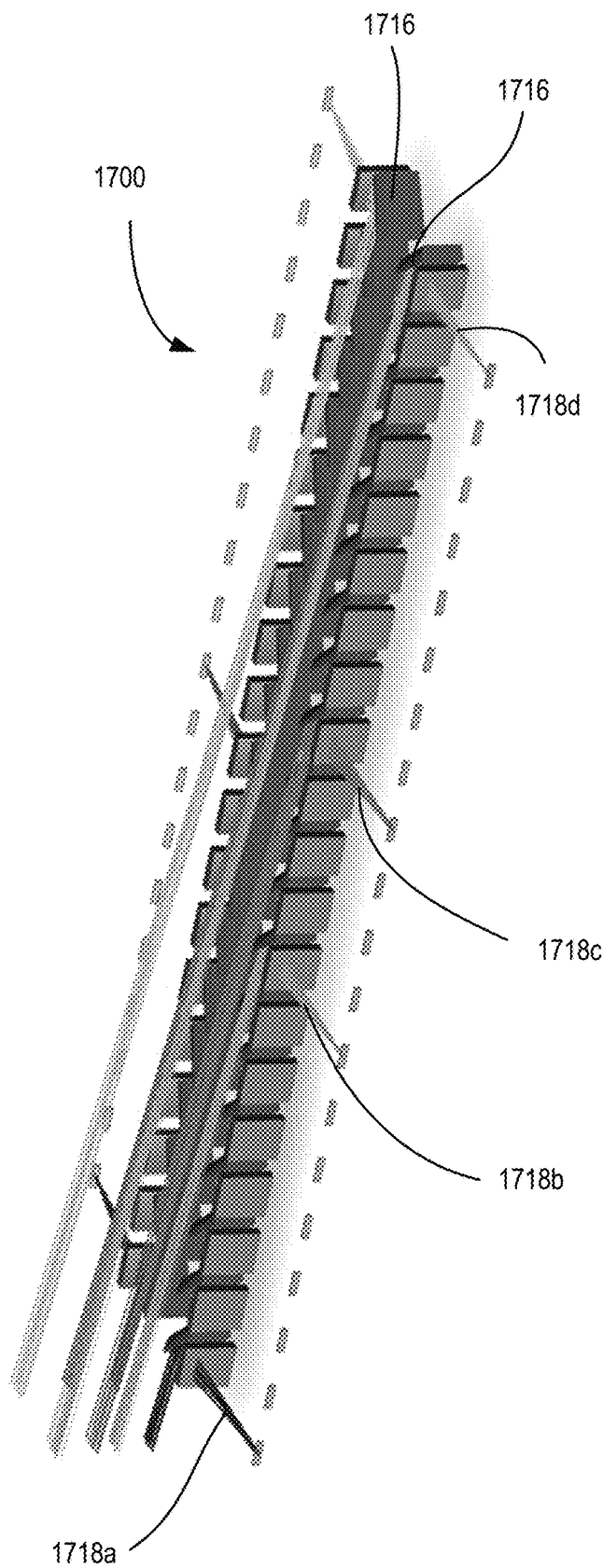
FIG. 17B
FIG. 17C

DIODE LASER APPARATUS WITH FAC LENS OUT-OF-PLANE BEAM STEERING

CROSS REFERENCE TO RELATED APPLICATIONS

This application is a continuation of U.S. patent application Ser. No. 16/269,387, filed Feb. 6, 2019, now U.S. Pat. No. 10,833,482, issued Nov. 10, 2020, which claims the benefit of U.S Provisional Patent Application Nos. 62/627,165 that was filed Feb. 6, 2018, and 62/650,907 that was filed Mar. 30, 2018, all of which are incorporated herein by reference.

FIELD

The field is laser diode beam combining and packaging.

BACKGROUND

Laser diodes have been developed that produce substantial output powers that make possible a variety of applications. To further increase available optical power, laser diode assemblies have been produced in which output beams from a plurality of laser diodes are combined in fiber laser systems. Such laser diode assemblies are sometimes referred to as laser diode packages. There is a drive in the laser industry to constantly improve the brightness and minimize losses in laser diode packages in various applications, including to pump continuous wave fiber lasers (CWFL) and/or directly process material. However, various obstacles to achieving such improvements have remained, even with a pressing need for solutions without various drawbacks. The following disclosure describes such improvements.

SUMMARY

Apparatus examples redirect laser diode beams using fast axis collimators that are rotated and/or translated relative to the incident beams.

Selected examples comprise diodes situated to emit beams along optical axes in a plane parallel to a common surface, with fast axes of the emitted beams mutually perpendicular to the common surface and the optical axes, and comprise fast axis collimators arranged at an off-axis angle and/or offset with respect to the optical axes and situated to receive the beams and to collimate the beams and to direct the beams at a small angle with respect to the optical axes for subsequent beam stacking with turning mirrors. Methods include arranging diodes and collimators and operating diodes to form beam stacks including with fast axis collimators.

In some laser diode package embodiments, each Chip-on-Substrate (CoS) (for example, three COS's mounted on a supercarrier or directly to a housing surface) are placed on the same horizontal plane so that each has the same height and same thermal path to the housing and/or heatsink. In representative examples, laser diode beams are stacked in the vertical direction through optical methods. In some stacking examples, to achieve separation of beams in a vertical direction, with a flat CoS mount, a fast axis collimator (FAC) lens is used to steer the collimated beam up/down. In some examples, a wedge prism or a wedged slow axis collimator (SAC) in the vertical direction is used to steer the collimated beam to be parallel to the horizontal plane. Apparatus and related methods can provide a flat mounted diode package that can replace stair step machined parts with flat metal plates (or no stair step and plates), reducing laser diode junction temperatures and improving laser diode and laser diode package performance. In some examples, the absence of the stair step allows the use of other advanced material that is difficult or impossible to form or machine effectively, such as with high precision.

According to an aspect of the disclosed technology, apparatus include a first laser diode situated to emit a beam from an exit facet along an optical axis, the beam as emitted having perpendicular fast and slow axes perpendicular to the optical axis, a first fast axis collimator (FAC) optically coupled to the beam as emitted from the exit facet and configured to direct the beam along a redirected beam axis having a non-zero angle with respect to the optical axis of the first laser diode, a second laser diode situated to emit a beam from an exit facet of the second laser diode along an optical axis parallel to the optical axis of the first laser diode and with a slow axis in a common plane with the slow axis of the first laser diode, and a second fast axis collimator (FAC) optically coupled to the beam as emitted from the exit facet of the second laser diode and configured to direct the beam along a redirected beam axis having a non-zero angle with respect to the optical axis of the second laser diode. In some examples, the non-zero angle provided by the first FAC is greater than 2 degrees and less than 10 degrees. In other examples, the non-zero angle provided by the first is greater than 3 degrees and less than 6 degrees. In particular examples, the first laser diode comprises a laser diode bar including a plurality of bar emitters arranged in the common plane and the beam comprises a plurality of beams emitted from the respective bar emitters into the common plane that become redirected by the first FAC, and the apparatus further comprises a cylindrical lens array situated to receive the plurality of beams from the first FAC and to collimate the plurality of beams along respective slow axes. Some examples, further include a laser diode package housing having a housing surface and a submount configured to secure the first and second laser diodes in relation to the housing surface. Some submounts comprise a plurality of submount blocks spaced apart from each other and attached to the housing surface and the first and second laser diodes. Selected housing examples further include a mounting block mounted to the housing surface and the submount. Some housing examples include a cooling block coupled to the housing and configured to flow a coolant. In particular cooling block examples, the cooling block includes a cooling channel that is coupled to a thermal coupling surface of the housing that is situated opposite the housing surface. Some examples, include cured bonding material such as an adhesive or epoxy securing the first and second FACs to the submount and/or first and second laser diodes to provide the non-zero angle. In some examples, the non-zero angle between the optical axis of the first laser diode and its redirected beam axis is the same as the non-zero angle between the optical axis of the second laser diode and its redirected beam axis. Some examples further include first and second turning mirrors situated to receive the beams along the respective redirected beam axes and to turn the beams to become stacked along the fast axes. In some embodiments, at least one of the first or second turning mirrors includes a chamfer configured to provide clearance for the beam turned by the other of the first or second turning mirrors to propagate adjacent to the chamfer. Some examples further include first and second slow axis collimators situated to receive and collimate the beams received from the first and second fast axis collimators along the respective redirected beam axes and to collimate the slow axes of the beams. Further examples include focusing optics configured to couple the stacked beams into an optical fiber. Additional examples include a polarization multiplexer to combine the stacked beams with another stack of beams. Some embodiments include a housing configured to support the first and second laser diodes, and a lid configured to enclose the laser housing. In some examples, the non-zero angle between the optical axis of the first laser diode and its redirected beam axis is different from the non-zero angle between the optical axis of the second laser diode and its redirected beam axis. In selected examples, the non-zero angle between the optical axis of the first laser diode and its redirected beam axis is the same number but opposite sign as the non-zero angle between the optical axis of the second laser diode and its redirected beam axis. Some examples further include first and second wedge prisms situated to receive the beams along the respective redirected beam axes and configured to redirect the beams to propagate at a common angle with respect to the common plane. In some examples, the common angle is zero such that the beams propagate after the first and second wedge prisms along parallel and spaced apart beam axes. Some embodiments can include first and second wedged slow axis collimators situated to receive and collimate the beams received from the first and second fast axis collimators along the respective redirected beam axes, to collimate the slow axes of the beams, and to redirect the beams to propagate at a common angle with respect to the common plane. Some embodiments include first and second turning mirrors situated to receive the beams along the respective redirected beam axes and to turn the beams to become stacked along the fast axes and to redirect the beams to propagate at a common angle with respect to the common plane. In representative examples, the first FAC has an optical axis arranged at an angle with respect to the optical axis of the first laser diode to produce the non-zero angle of the redirected beam axis. In some examples, the angle of the optical axis of the FAC with respect to the optical axis of the first laser diode is less than 2% different from the non-zero angle of the redirected beam axis. In particular examples, the first FAC has a flat input surface perpendicular to the optical axis of the first FAC and that is arranged at an angle with respect to the exit facet that is the same as the non-zero angle between the redirected beam axis of the beam emitted from the first laser diode and the optical axis of the first laser diode. In representative examples, the optical axis of the first FAC intersects the optical axis of the first laser diode at its exit facet. In typical examples, the intersection corresponds to a focal point or focal line of the first FAC. In some examples, the first FAC is a cylindrical planoconvex lens or a cylindrical bi-convex lens. In particular embodiments, the first FAC has an acceptance angle extension on a side of the optical axis for the first FAC that is opposite the non-zero angle. In selected examples, the first FAC has an optical axis parallel to the optical axis of the first laser diode but spaced apart by a distance that produces the non-zero angle between the optical axis of the first laser diode and its redirected beam axis.

According to another aspect of the disclosed technology, apparatus include a first laser diode situated to emit a beam from an exit facet along an optical axis, the beam as emitted having perpendicular fast and slow axes perpendicular to the optical axis, a first fast axis collimator (FAC) optically coupled to the beam as emitted from the exit facet and configured to direct the beam along a redirected beam axis having a non-zero angle with respect to the optical axis of the first laser diode, a second laser diode situated to emit a beam from an exit of the second laser diode along an optical axis parallel to the optical axis of the first laser diode and with a slow axis in a common plane as the slow axis of the first laser diode, and a second fast axis collimator (FAC) optically coupled to the beam as emitted from the exit facet of the second laser diode and configured to direct the beam along a beam axis that is collinear with the optical axis of the second laser diode.

According to a further aspect of the disclosed technology, apparatus include a first laser diode situated to emit a beam from an exit facet along an optical axis, the beam as emitted having perpendicular fast and slow axes perpendicular to the optical axis, and a first fast axis collimator (FAC) optically coupled to the beam as emitted from the exit facet and configured to direct the beam along a redirected beam axis having a non-zero angle with respect to the optical axis of the first laser diode, wherein the first FAC has an optical axis arranged at an angle with respect to the optical axis of the first laser diode to produce the non-zero angle of the redirected beam axis.

The foregoing and other objects, features, and advantages of the disclosed technology will become more apparent from the following detailed description, which proceeds with reference to the accompanying figures.

BRIEF DESCRIPTION OF THE DRAWINGS

FIGS. 17A-17C are perspective and side views of a laser diode package optical layout with simulated optical results.

DETAILED DESCRIPTION

Figure 1:
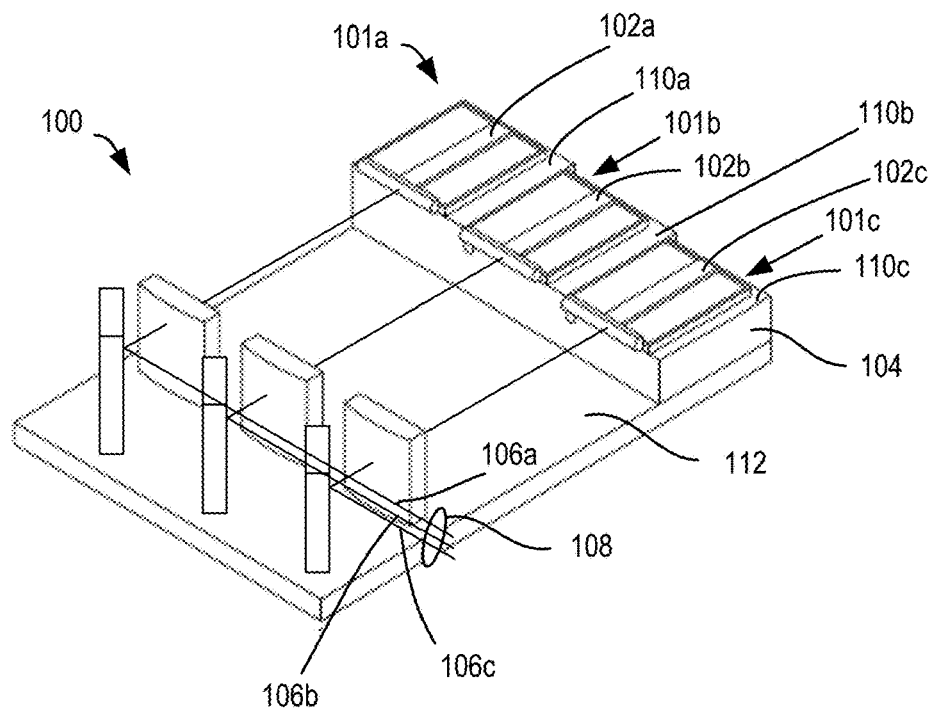
FIG. 1 is a perspective view of a laser diode package apparatus using a stepped mounting surface.

Laser diode packages are typically configured to stack beams emitted from the laser diodes in a fast axis. Various optics in the diode packages collimate, direct, and focus the beams onto an input surface of a fiber that will transmit the combined beams to another apparatus, such as a fiber laser or other laser processing apparatus. Total available power can be increased by increasing the number of laser diodes in the diode package. However, the laser diodes used to form the beam stack typically must be spaced apart. The number of beams in a beam stack delivered to an input surface of a fiber determines the size of the beam stack. Therefore, the number of beams that can be practically combined is limited. Diode packages utilize different methods to physically separate the beams in the fast axis of the laser diode. In an example package layout 100, shown in FIG. 1, chip-on-submounts (COS's) 101a-101c have laser diodes 102a-102c arranged in a stair-step pattern on a stepped diode mount block 104. Collimated beams 106a-106c from the lasers diodes 102a-102c are formed into a beam stack 108. One problem that can be associated with such a stair-step architecture is that the laser diodes 102a-102c individually secured to separate stair-steps 110a-110c of the stepped diode mount 104 have increasing step heights and thus correspondingly increased thermal paths to the housing surface 112. The laser diodes 102a-102c operate at increasingly higher temperature as the thermal path increases. In general, temperature can negatively affect several laser diode parameters, particularly laser diode power and laser diode reliability. Thus, the stair-step architecture of the package layout 100 can reduce power and reliability in some laser diode packages. Also, the stepped diode mount block 104 typically requires very tight tolerance in machining the surfaces and shape, increasing expense and manufacturing complexity, and can limit the choice of materials due to machinability requirements for the stair step shape and the higher thermal resistance due to the increased step height. The resulting higher operating temperature device can reduce acceptable running power and/or decrease device reliability. The different thermal paths between the stair-steps 110a-110c and the housing surface 112 can lead to undesirable variation in junction temperature of the laser diodes 102a-102c, resulting in different laser diode performance and variation in lasing wavelength. After the heights of stair-steps 110a-110c become fixed, it is generally difficult to change without major changes to package design architecture, process and tooling equipment, as well as optical modeling and bpp or brightness optimizations of the array of beams stacked in the fast axis. Furthermore, the stair-steps 110a-110c, or the stepped diode mount block 104 itself, adds large volume and weight to a typical laser diode package, which is also undesirable in applications or environments where a lower package weight may be required.

Figure 2:
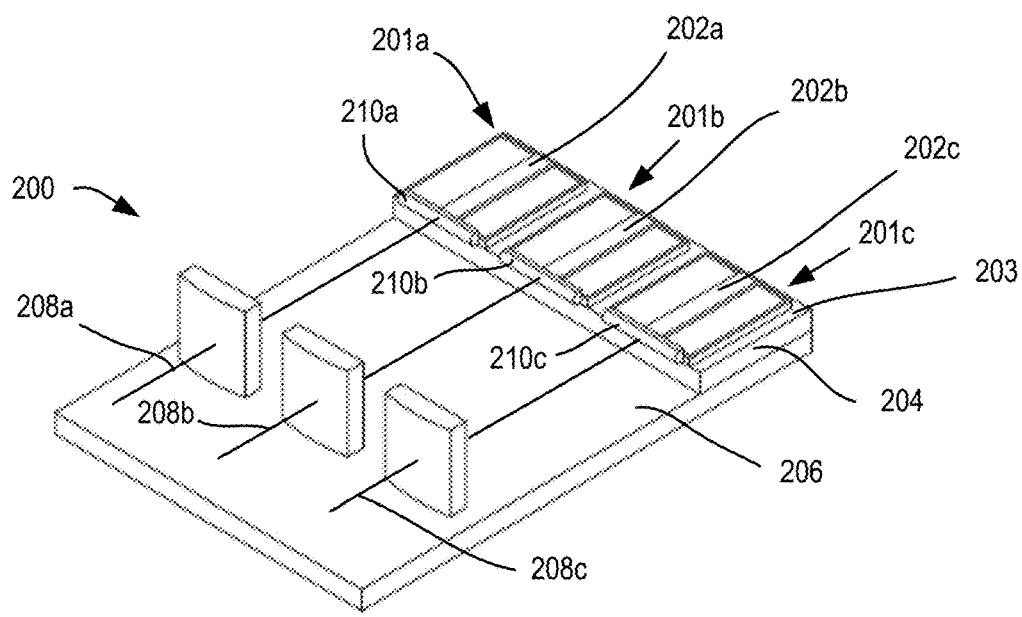
FIG. 2 is a perspective view of an example laser diode package apparatus using a flat mounting surface.

In various examples herein, many or all of the problems associated with the stepped diode mount block 104 are overcome with laser diode package configurations, having each Chip-on-Substrate (CoS) (for example, three COS's in a supercarrier) placed on a common plane so that each has the same height and same thermal path to the housing and heatsink. For example, with reference to FIG. 2, a laser diode package layout 200 includes three CoS's 201a-201c having laser diodes 202a-202c respectively mounted thereon. However, the CoS's 201a-201c are mounted to a common planar surface 203 of a mounting block 204 parallel to a housing surface 206. In contrast with the package layout 100, collimated laser beams 208a-208c can be stacked in a vertical direction through optical methods. Thus, in selected examples herein, to achieve the separation of beams in a vertical direction, a flat CoS mount is used to emit laser diode beams and fast axis collimator (FAC) lenses 210a-210c are used to steer the beams 208a-208c up/down and to provide fast-axis collimation. In some examples, an optional wedge prism is used to redirect steered beams in the vertical direction, and in other examples a wedged SAC lens is used to steer the collimated beam to be parallel to the horizontal plane. In additional examples, disadvantages associated with stepped mounting blocks can be overcome with multiple diode lasers mounted on a flat surface, and the beams from the multiple diode lasers are stacked in the vertical direction by directing the beams out of plane at an angle through fast-axis-collimation (FAC) lens beam steering. Thus, in various examples, substantially flat housing mounting surfaces can be provided, simplifying and improving accuracy of package fabrication. Thus, flat laser diode packages can be manufactured, replacing stair step machined parts with simple flat metal plate (or no plate), reducing the junction temperature of the diodes and improve laser diode performance. Furthermore, for flat metal plate examples, additional materials can be used that are normally difficult to form or machine into high precision stair step mounts. Small weight and volume can be provided with planarized mechanical design, and improved diode laser power and efficiency through effective heat dissipation can be achieved. Flat housing baseplates can also allow efficient conductive cooling using industrial heatsinks or easy integration of cooling manifolds into the housing baseplate.

Figure 3:
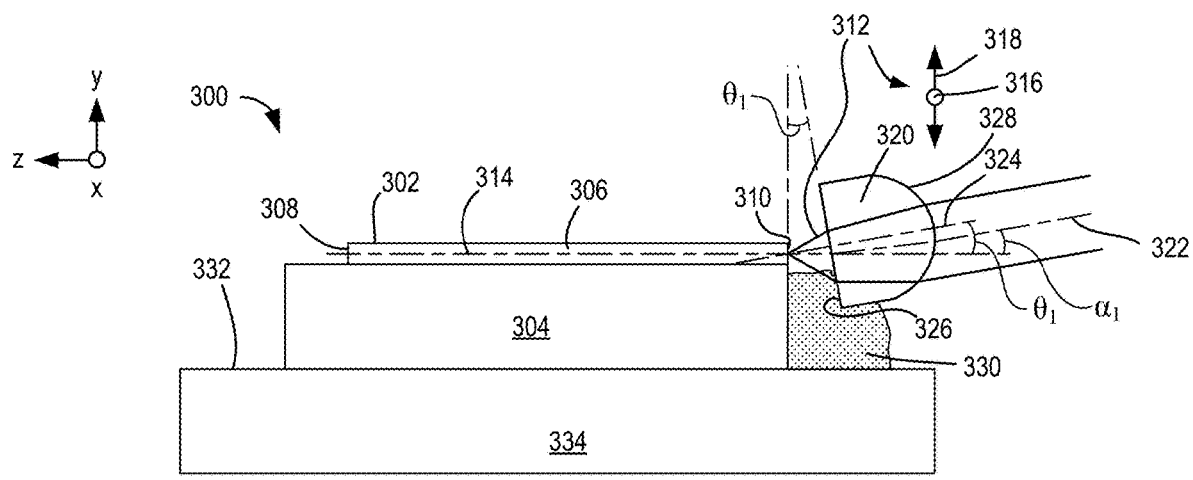
FIG. 3 is a side view of an example fast axis collimator beam steering apparatus.
Figure 4:
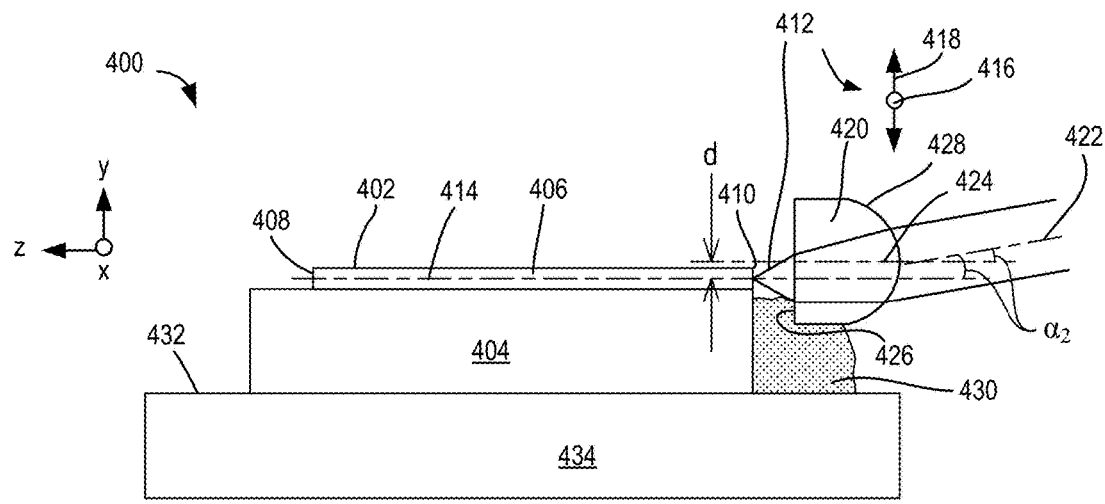
FIG. 4 is a side view of another example of a fast axis collimator beam steering apparatus.

FIG. 3 is an example of a beam redirecting laser diode apparatus 300 that includes a laser diode 302 mounted to a submount 304. The laser diode 302 includes a semiconductor gain medium 306 extending between opposite rear and exit facets 308, 310. A laser beam 312 is emitted from the exit facet 310 along an optical axis 314 of the laser diode 302, with a slowly diverging beam axis, or slow axis 316, extending perpendicular to the plane of FIG. 3 and perpendicular to the optical axis 314, and a rapidly diverging beam axis, or fast axis 318, extending vertically in FIG. 3 and perpendicular to the optical axis 314. A fast axis collimator (FAC) 320 is situated in relation to the laser diode 302 to receive the laser beam 312, to collimate the laser beam 312 along the fast axis 318, and to redirect the laser beam 312 along a redirected beam axis 322 as a fast-axis collimated laser beam propagating at a small angle $\alpha_1$ with respect to the optical axis 314. The redirected beam axis 322 is produced by varying an orientation of the FAC 320 such that an optical axis 324 of the FAC 320 is at an angle $\theta_1$ with respect to the optical axis 314 of the laser diode 302. In representative examples, the redirection angle $\alpha_1$ is substantially close to the rotation angle $\theta_1$ of the FAC 320, e.g., within 2°, 1°, 0.5°, 0.1°, etc., or e.g., within 10%, 5%, 2%, 1%, 0.1%, of each other, etc. In representative examples, the optical axis 324 and corresponding focal point (or line) intersects the optical axis 314 at the exit facet 310 of the laser diode 302. By providing the rotation of the FAC 320 at the angle $\theta_1$, reduced optical aberrations can be obtained over a beam redirection provided by a translation of the optical axis 324 relative to the optical axis 314 alone (such as shown in FIG. 4). Further, by providing the orientation of the FAC 320 with the rotation and translation such that the intersection of the optical axes 314, 324 and the focal point of the FAC 320 is situated at the exit facet 310, reduced optical aberrations in the laser beam 312 can be obtained relative to translating the FAC 320 alone or rotating the FAC 320 alone, which can further improve coupling efficiency in subsequent beam combining operations such as the coupling of the laser beam 312 into an optical fiber. This is at least because spherical wavefronts are emitted from the point source (exit facet 310) and are on-axis at the focal point of the FAC 320, such that the curvatures of both the source and lens curved surfaces share a symmetry through a common axis. The beam redirection can be used advantageously in various applications, including arrangements of multiple laser diodes or laser diode bars emitting beams with slow axes in a common plane and combining and coupling the beams into an optical fiber, as discussed further in examples herein.

In representative examples, the FAC 320 is a planoconvex cylindrical lens with a flat input surface 326 receiving the laser beam 312 as-emitted from the exit facet 310. Examples of the FAC 320 can also include bi-convex cylindrical lenses. The FAC 320 can include a spherical (cylindrical) output surface 328 or aspheric or other curves can be used. In representative examples, the angle $\alpha_1$ is relatively small, such as between 2° and 10°, 3° and 8°, or 4° and 5°, though other angles are possible. While shown angled generally upwards in FIG. 3, in some examples the FAC 320 can be angled downwards in FIG. 3 as well. The FAC 320 can be secured in relation to the laser diode 302 at the angle $\theta_1$ with a UV cured epoxy, high temperature glue, or other suitable bonding material 330 for bonding lenses to various structures. The submount 304 can be attached to a mounting surface 332, such as a surface of a housing 334 of a laser diode package, with fasteners, solder, epoxy, or other bonding agent. The FAC 320 can be secured to the submount 304, the laser diode 302, the mounting surface 332, other intermediate securing members, or any combination as convenient to provide the FAC 320 in fixed relation to the laser diode 302 at the predetermined angle $\theta_1$. In some examples, the FAC 320 can contact one or more of the submount 304, laser diode 302, and mounting surface 332. The bonding material 330 can extend above to a top surface of the submount 304 and/or laser diode 302.

FIG. 4 is an example of another beam redirecting laser diode apparatus 400 that includes a laser diode 402 mounted to a submount 404. The laser diode 402 includes a semiconductor gain medium 406 extending between opposite rear and exit facets 408, 410. A laser beam 412 is emitted from the exit facet 410 along an optical axis 414 of the laser diode 402, with a slowly diverging beam axis, or slow axis 416, extending perpendicular to the plane of FIG. 4 and perpendicular to the optical axis 414, and a rapidly diverging beam axis, or fast axis 418, extending vertically in FIG. 4 and perpendicular to the optical axis 414. A fast axis collimator (FAC) 420 is situated in relation to the laser diode 402 to receive the laser beam 412, to collimate the laser beam 412 along the fast axis 418, and to redirect the laser beam 412 along a redirected beam axis 422 as a fast-axis collimated laser beam. The redirected beam axis 422 is provided at an angle $\alpha 2$ relative to the optical axis 414 and is produced by varying an orientation of the FAC 420 such that an optical axis 424 of the FAC 420 is parallel and spaced apart by a predetermined distance d with respect to the optical axis 414 of the laser diode 402.

In representative examples, the FAC 420 is a planoconvex cylindrical lens with a flat input surface 426 receiving the laser beam 412 as-emitted from the exit facet 410, though bi-convex lenses can be used as well in some examples. The FAC 420 can include a spherical (cylindrical) output surface 428 or aspheric or other curves can be used. In representative examples, the angle $\alpha 2$ produced with the distance d is relatively small, such as between 2° and 10°, 3° and 8°, or 4° and 5°, though other angles are possible. While shown angled generally upwards in FIG. 1, in some examples the FAC 420 the redirected beam axis can be downward angled as well, by providing the spaced apart distance d with the optical axis 424 below the optical axis 414 in FIG. 4. The FAC 420 can be secured in relation to the laser diode 402 at the distance d with a UV cured epoxy, high temperature glue, or other suitable bonding material 430 for bonding lenses to various structures. The submount 404 can be attached to a mounting surface 432, such as a surface of a housing 434 of a laser diode package, with fasteners, solder, epoxy, or other bonding agent. The FAC 420 can be secured to the submount 404, the laser diode 402, the mounting surface 432, other intermediate securing members, or any combination as convenient to provide the FAC 420 in fixed relation to the laser diode 402 to produce the predetermined angle $\alpha 2$. In some examples, the FAC 420 can contact one or more of the submount 404, laser diode 402, and mounting surface 432. The bonding material 430 can extend above to a top surface of the submount 404 and/or laser diode 402.

Figure 5A:
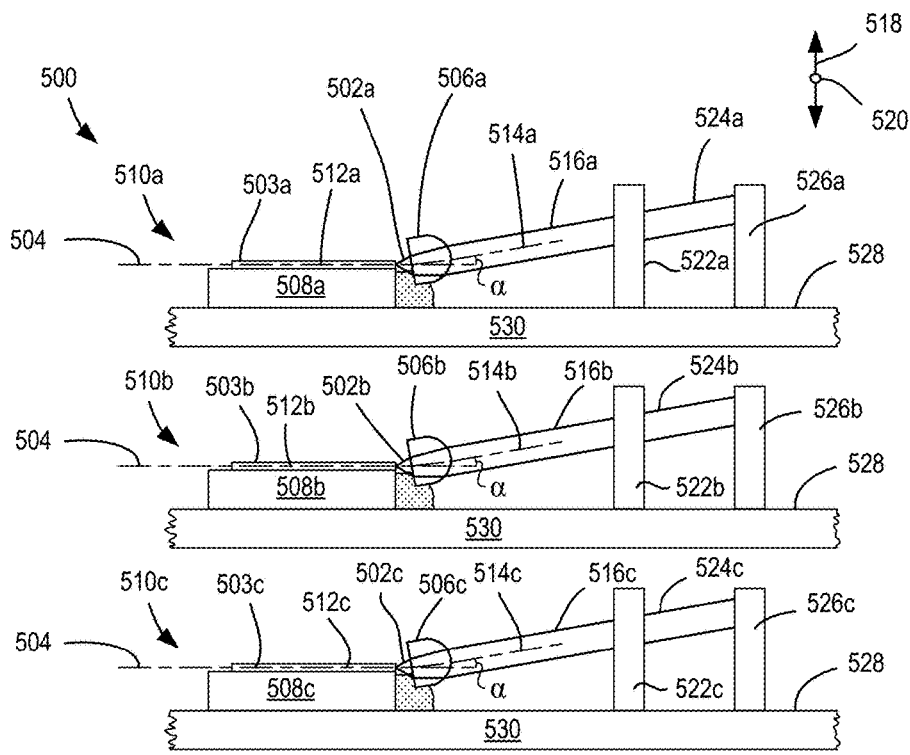
FIG. 5A is a side view of another example fast axis collimator beam steering apparatus.
Figure 5B:
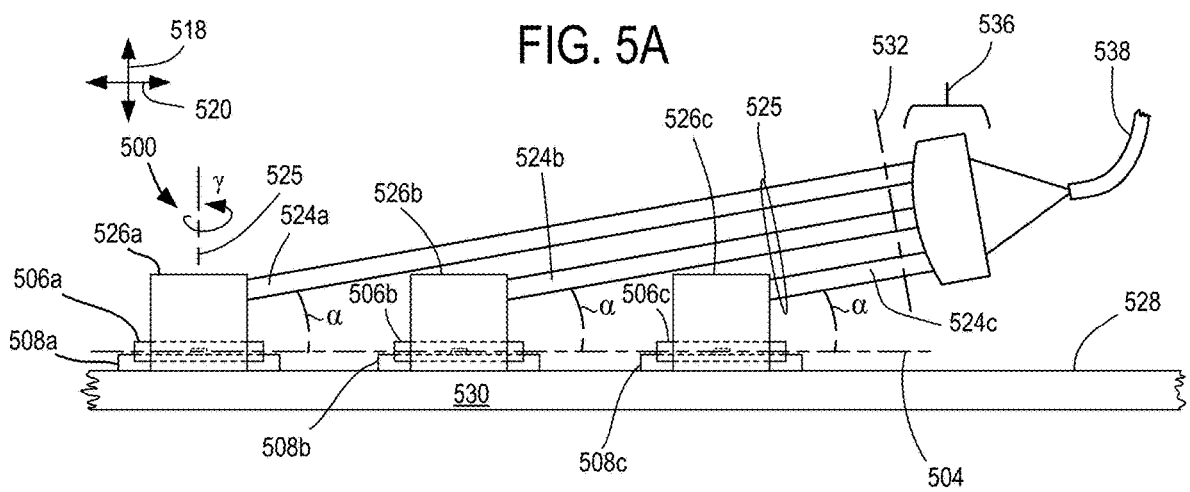
FIG. 5B is an end view of the fast axis collimator beam steering apparatus shown in FIG. 5A.

FIGS. 5A-5B show part of a laser diode package 500 that steers laser diode beams 502a-502c as-emitted from respective laser diodes 503a-503c out of a common plane 504 using fast axis collimators 506a-506c. Each of the laser diodes 503a-503c is mounted on a respective submount 508a-508c so as to form chip-on-submounts 510a-510c. The laser diode beams 502a-502c are emitted along parallel beam axes 512a-512c in the common plane 504 and are steered to propagate along parallel redirected beam axes 514a-514c at an angle α to the common plane 504 and to form fast-axis collimated beams 516a-516c. Thus, the laser diode beams 502a-502c have fast axes that are aligned in a vertical direction 518 in FIG. 5A and slow axes that are aligned in a direction 520 into the plane of FIG. 5A (or horizontally in FIG. 5B). The fast-axis collimated beams 516a-516c are received by slow axis collimators 522a-522c that collimate the respective slow axes of the fast-axis collimated beams 516a-516c to form collimated beams 524a-524c that are collimated along both fast and slow axes. In representative examples, the slow axis collimators 522a-522c do not substantially change beam direction with respect to the fast axis 518.

The collimated beams 524a-524c are redirected about an azimuth angle γ (such as 90° though other angles are possible or may be preferred) of an axis 525 perpendicular to the common plane 504 with respective turning mirrors 526a-526c rotated at γ/2. The turning mirrors 526a-526c typically have planar reflective surfaces arranged perpendicular to the common plane 504. Thus, the redirection angle α of the collimated beams 524a-524c can remain the same before and after reflection by the turning mirrors 526a-526c. The separate chip-on-submounts 510a-510c are shown above one another in FIG. 5A for convenience of illustration, and each chip-on-submount 510a-510c is mounted with epoxy or solder to a common surface 528, such as a surface of a housing 530 or other mounting block, typically extending parallel to the common plane 504. In representative examples, the slow axis collimators 522a-522c and the turning mirrors 526a-526c can also be mounted to the common surface 528, such as with epoxy or solder. The housing 530 is typically thermally conductive, so that heat generated during operation of the laser diodes 503a-503c can be sunk to or through the housing 530. As shown in FIG. 5B, the spacing between the laser diodes 503a-503c (and corresponding chip-on-submounts 510a-510c) and the redirection angle α are configured with respect to the characteristics of the collimated beams 524a-524c and turning mirrors 526a-526c such that the beam clipping is reduced or does not occur. For example, the collimated beam 524a propagates above without being clipped by an edge of the turning mirror 526b, and the collimated beam 524b propagates above without being clipped by an edge of the turning mirror 526c.

Figure 5C:
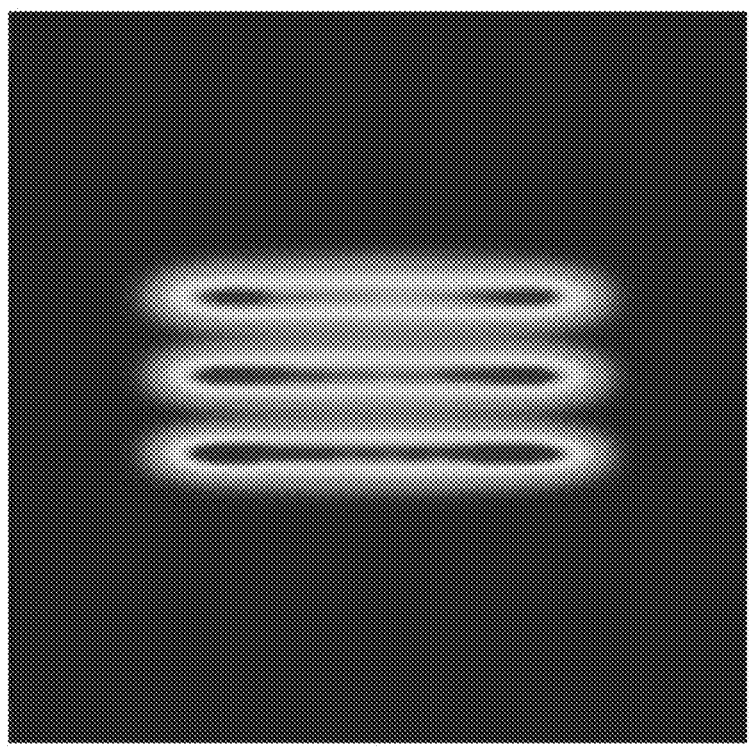
FIG. 5C is a beam cross-section in NA space for the beams in an afocal plane of the fast axis collimator beam steering apparatus shown in FIG. 5A.

After redirection by the turning mirrors 526a-526c, the collimated beams 524a-524c are stacked along the fast axis to form a beam stack 525, such that each beam fast axis is collinear and each beam slow axes are parallel and spaced apart. FIG. 5C is a modeled cross-sectional image 534 of the collimated beams 524a-524c in an afocal plane (in NA space), such as reference plane 532. The collimated beams 524a-524c are received by coupling optics 536, such as an objective lens, that focus and couple the collimated beams 524a-524c into an optical fiber 538. As can be seen from the image 534, the collimated beams 524a-524c are stacked without having a slant relative to each other. That is, the beam stack 525 has an envelope or boundary that is or close to square or rectangular in shape, which can provide favorable beam quality suitable for coupling the beam stack 525 into the optical fiber 538 efficiently and with low NA.

Figure 6:
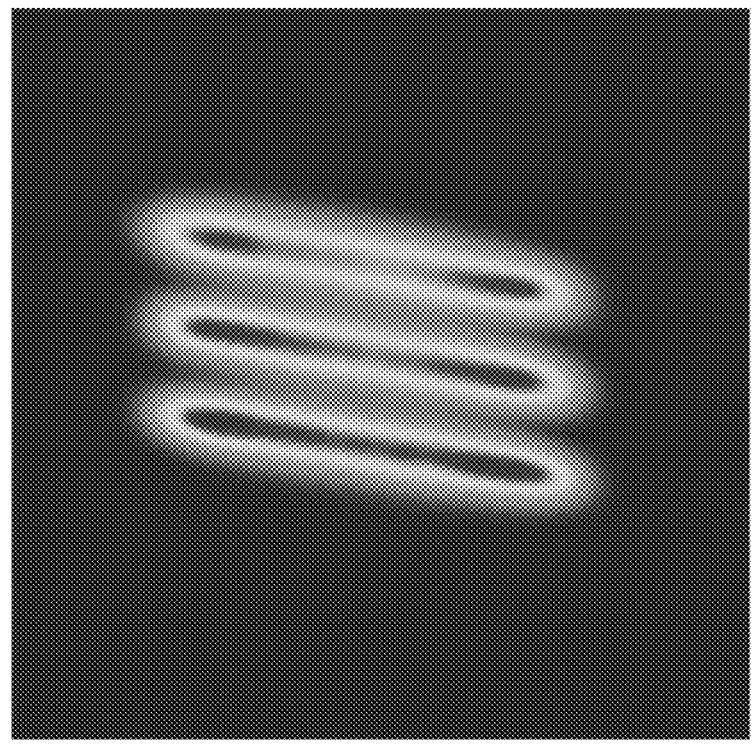
FIG. 6 is a beam cross-section in NA space for beams steered using other apparatus and methods, for comparison with FIG. 5C.

An example of a slanted beam cross-sectional image 600, shown in FIG. 6, can result from using beam combining approaches that do not use the fast axis steering methods and configurations described herein, such as by steering beams with the turning mirrors 526a-526c. By using tilted turning mirrors to direct diode laser beams propagating in a common plane aligned with the slow axes of the beams as emitted from a plurality of laser diodes to propagate out of the common plane, the fast and slow axes of each diode laser beam become rotated by a finite angle. In generating a vertical beam stack 602, a parellogram envelope shape is formed with a line connecting the center of each beam that is not perpendicular to the slow axes of the beams, which can lead to poor beam quality with reduced fiber-coupled optical power and/or increased NA. Also, polarization multiplexing of the laser diode beams with the slanted characteristics can result in power losses, as one of the polarization axes of a polarization multiplexer, which is typically set parallel to the center line of the beam stack, is not perpendicular to the slow axes of the beams, which is parallel or perpendicular to the beam polarization axis. The resulting polarization multiplexing can result in rejected transmission through the multiplexer from an orthogonal polarization.

The redirection angle α can be selected such that beams in the beam stack 525 lie adjacently as closely as possible without substantial impingement on the turning mirrors 526a-526c. With too small of an angle, substantial beam clipping by the turning mirrors 526a-526c can occur and result in power loss, but too large of an angle can increase an NA of the beam stack 525 and reduce the brightness of the beam stack 525. In a particular example, a redirection angle α of 5° is provided with the fast-axis collimators 506a-506c, which can provide a beam spacing offset of 350 μm in the fast axis direction in reference plane 532 using two turning mirrors 4 mm apart. Such a beam offset spacing can correspond to a beam spacing produced with a 350 μm step size in the separate stair-steps 110a-110c shown in FIG. 1. In representative examples, various piece-parts in the laser diode package 500 can be identical, including the chip-on-submounts 510a-510c, fast axis collimators 506a-506c, slow axis collimators 522a-522c, and turning mirrors 526a-526c, thereby reducing manufacturing complexity and error rate. As shown, the three laser diodes 503a-503c are shown along with associated sets of optical components. However, it will be appreciated that more or fewer laser diodes and corresponding sets of optical components can be used. In representative examples, the redirection angle α is produced by angling optical axes of the fast axis collimators 506a-506c relative to the optical axes of the laser diode beams 502a-502c in the common plane 504. In selected examples, to produce the redirection angle α the optical axes of the fast axis collimators 506a-506c intersect the optical axes of the laser diode beams 502a-502c at the exit facets of the laser diodes 503a-503c such that the focal point (or line) of the fast axis collimators 506a-506c lies at the exit facets, resulting in a translation of the fast axis collimators 506a-506c and a rotation (and the redirection angle α can be substantially the same as or close to the amount of the rotation of the fast axis collimators 506a-506c about the focal point). In additional examples, the redirection angle α is produced by a parallel translation of the optical axes of the fast axis collimators 506a-506c relative to the optical axes of the laser diode beams 502a-502c. However, in general, a reduced aberration in the redirected fast-axis collimated beams 516a-516c can be achieved by using a rotation of the optical axes (or planes) of the fast axis collimators 506a-506c rather than using a parallel translation, and a particularly superior reduction in aberration can be obtained by using rotation and translation, such as by providing optical axial intersection at exit facets as stated above. In representative examples, the chip-on-submounts 510a-510c can be mounted directly to the housing 530 (e.g., on the common surface 528), thereby decreasing a length of a heat conductive path to the housing 530. In additional examples, the chip-on-submounts 510a-510c can be mounted to an intermediate thermally conductive structure such as one or more mounting blocks (e.g., the mounting block 204 shown in FIG. 2 or separate ones). With directly mounting the chip-on-submounts 510a-510c to the housing 530, the submounts 508a-508c (or submount if a single one is used for multiple mounted laser diodes) can have a thickness provided such that the laser diodes 503a-503c are mounted as close to the common surface 528 as allowed mechanically by the shape of the fast axis collimators 506a-506c as the upwardly steered fast-axis collimated beams 516a-516c can avoid impinging the common surface 528 (if extended planar) even with a finite residual fast axis beam divergence in the fast-axis collimated beams 516a-516c. The close positioning relative to the common surface 528 can also relieve height requirements for the turning mirrors 526a-526c.

Figure 7A:
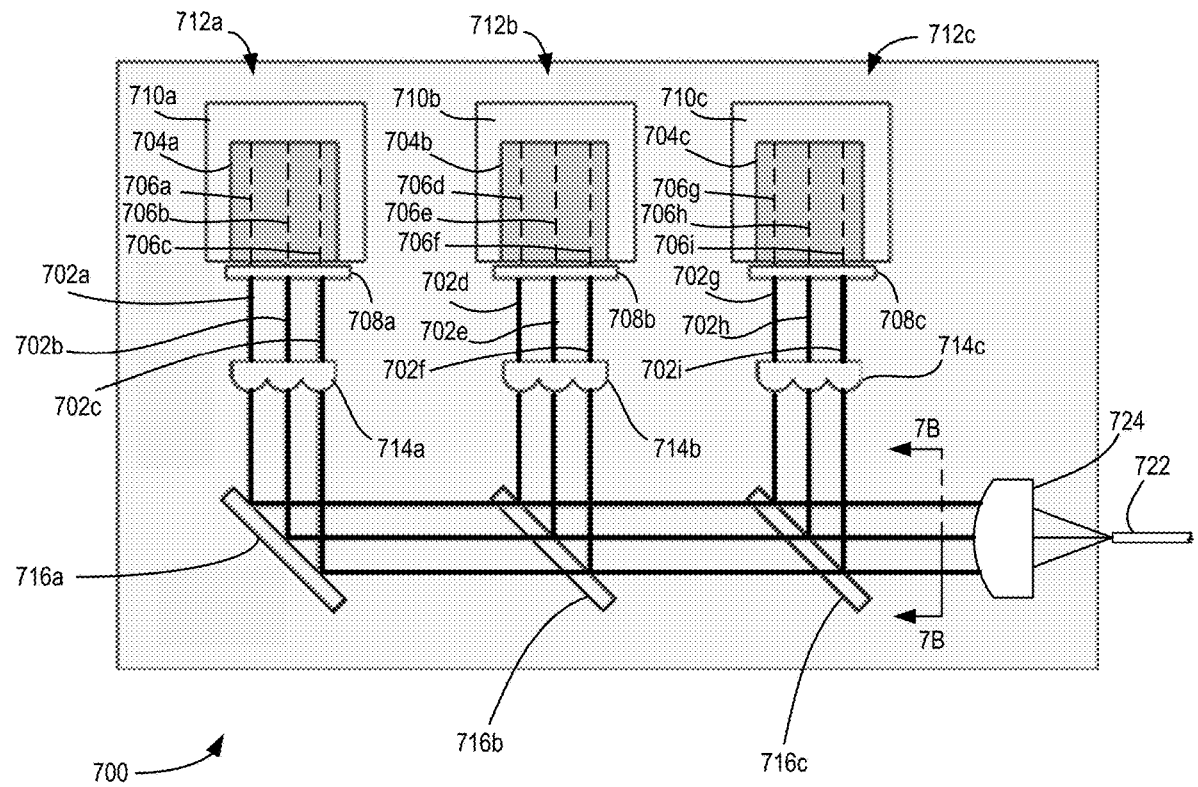
FIG. 7A is a top view of another example fast axis collimator beam steering apparatus.
Figure 7B:
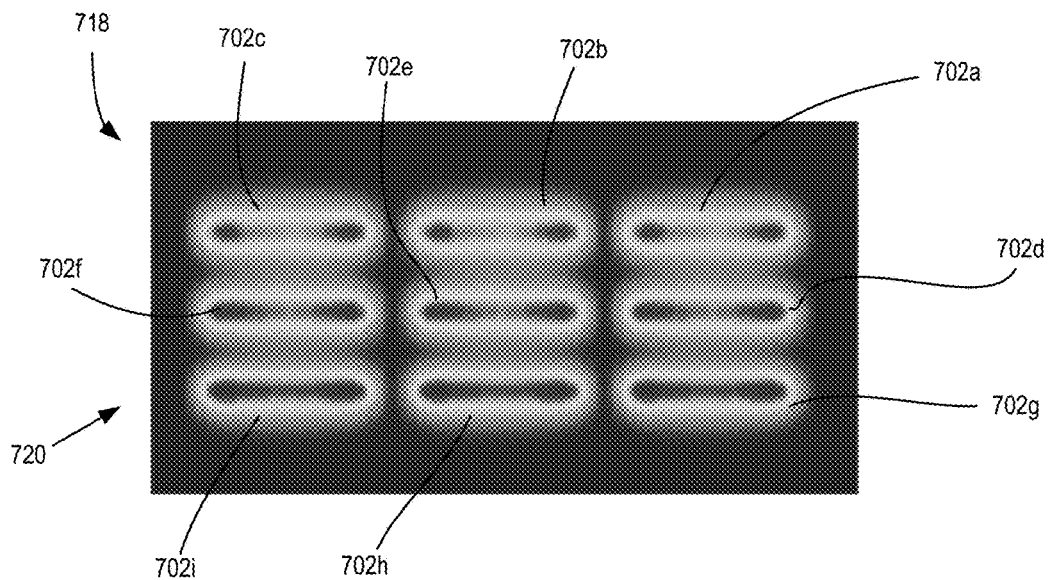
FIG. 7B is a beam cross-section in NA space for the in an afocal plane of the fast axis collimator beam steering apparatus shown in FIG. 7A.

FIGS. 7A-7B show an example laser diode package 700 configured to steer laser diode beams 702a-702i as-emitted from laser diode bars 704a-704c having respective laser diode bar emitters 706a-706c, 706d-706f, 706g-706i, by using angled and/or offset fast axis collimators 708a-708c. The laser diode bars 704a-704c are mounted to submounts 710a-710c to form chip-on-submounts 712a-712c. The laser diode beams 702a-702i have a common slow axis as-emitted from the respective laser diode bars 704a-704c. Slow axis collimators 714a-714c, such as one or more cylindrical lens arrays, are situated to receive the laser diode beams 702a-702i after being steered and fast-axis collimated by the fast axis collimators 708a-708c, to collimate the laser diode beams 702a-702i along their respective slow axes. The laser diode beams 702a-702i are directed out of a common plane of FIG. 7A at a selected small angle (such as between about 2° and 20°, and more typically between about 4° and 6°), and turned using turning mirrors 716a-716c. The small angle and the spacing between the turning mirrors 716a-716c is selected so that the laser diode beams 702a-702i avoid impingement of upon the turning mirrors 716a-716c. In representative examples, the turning mirrors 716a-716c have reflective surfaces perpendicular to the plane of FIG. 7A (such as a laser diode package housing surface) such that the small angle remains the same after reflection by the turning mirrors 716a-716c. FIG. 7B shows a cross-sectional image 718 of the laser diode beams 702a-702i after reflection by the turning mirrors 716a-716c in a plane perpendicular to beam propagation direction. The reflected beams form a beam stack 720 with a square or rectangular shape (or close to square or rectangular) with beams stacked along slow and fast axes. The beam stack 720 is typically coupled into an optical fiber 722 with focusing optics 724, and in representative examples, the optical axes of the optical fiber 722 and focusing optics 724 are arranged at the small angle with respect to the common plane of FIG. 7A.

Figure 8A:
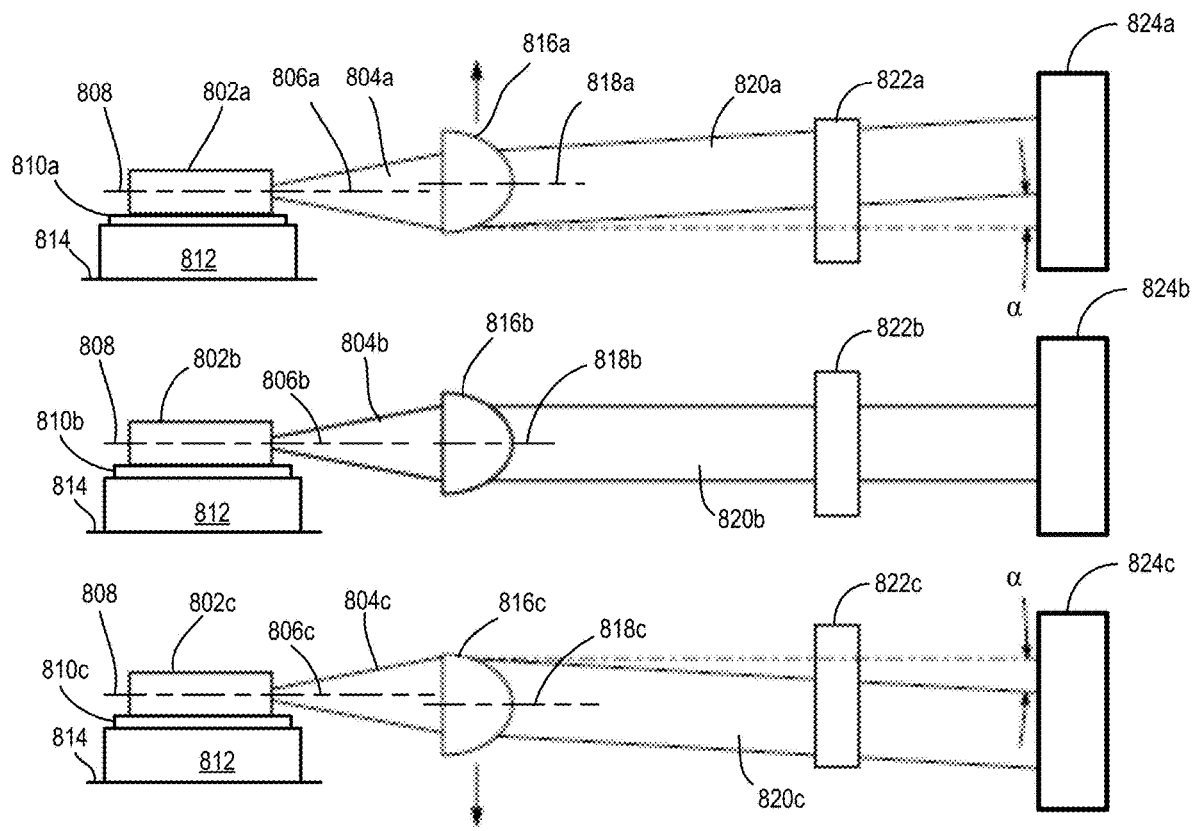
FIG. 8A is a side view of a another example fast axis collimator beam steering apparatus.
Figure 8B:
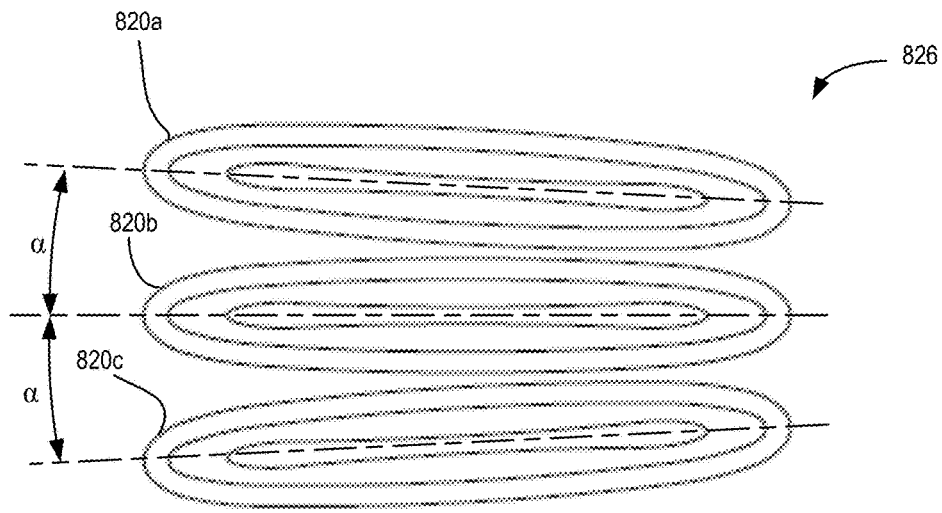
FIG. 8B is a beam cross-section in NA space for the beams in an afocal plane of the fast axis collimator beam steering apparatus shown in FIG. 8A.

FIGS. 8A-8B show an example of a multi-angle fast-axis beam steering apparatus 800. A plurality of laser diodes 802a-802c are arranged to emit respective laser diode beams 804a-804c with optical axes 806a-806c and slow axes situated in a common plane 808. The laser diodes 802a-802c can be mounted on respective submounts 810a-810c that are mounted to a common supercarrier mounting block 812. The supercarrier 812 is mounted to a housing surface 814 of the multi-angle fast-axis beam steering apparatus 800. The laser diodes 802a-802c are situated adjacently into the plane of FIG. 8A, but are shown separately in a vertical direction for convenience of illustration, breaking up the common plane 808.

The laser diode beams 804a-804c are received by respective fast axis collimators 816a-816c having optical axes 818a-818c. The fast axis collimator 816a is shifted upwards in FIG. 8A, such that the optical axis 818a is spaced apart in the vertical direction from the optical axis 806a of the laser diode beam 804a as-emitted from the laser diode 804a. In some examples, the fast axis collimator 816a is rotated or both rotated and offset with respect to the optical axis 806a to vary an orientation of the fast axis collimator 816a. A corresponding laser diode beam 820a is refracted and collimated but steered upward at an angle α with respect to the common plane 808. The laser diode beam 820a is collimated in the slow axis with a slow axis collimator 822a and received by a turning mirror 824a, and the distance of propagation of the laser diode beam 820a between the fast axis collimator 816a and the turning mirror 824a results in an upward beam displacement by a selected amount relative to an unsteered beam (such as laser diode beam 804b). The fast axis collimator 816b is not shifted upwards or downwards or rotated with respect to the laser diode optical axis 806b in FIG. 8A, and thus the optical axis 818b is collinear with the optical axis 806b of the laser diode beam 804b as-emitted from the laser diode 804b. A corresponding laser diode beam 820b is refracted and collimated but not steered at an angle with respect to the common plane 808. The laser diode beam 820b is collimated in the slow axis with a slow axis collimator 822b and received by a turning mirror 824b that reflects the beam at a selected angle (e.g., 90° so as to propagate into or out of the plane of FIG. 7A). The fast axis collimator 816c is shifted downwards in FIG. 8A, such that the optical axis 818c is spaced apart from the optical axis 806c of the laser diode beam 804c as-emitted from the laser diode 804c. In some examples, the fast axis collimator 816c is rotated or both rotated and offset with respect to the optical axis 806c. A corresponding laser diode beam 820c is refracted and collimated but steered downward at an angle α with respect to the common plane 808. The laser diode beam 820c is collimated in the slow axis with a slow axis collimator 822c and received by a turning mirror 824c, and the distance of propagation of the laser diode beam 820c between the fast axis collimator 816c and the turning mirror 824c results in a downward beam displacement by a selected amount relative to an unsteered beam (such as laser diode beam 804b).

By comparison, in some laser diode package architectures, such as that shown in FIG. 1, a vertical separation between beams can be approximately 0.45 mm and provided by a stair-stepped arrangement of laser diode emitters. In the multi-angle fast-axis beam steering apparatus 800, a 0.35 mm beam spacing at a position of the turning mirrors 824a-824c that is 12 mm from the laser diodes 802a-802c can be provided by selecting the angle α to be about 1.7° (α=0.35/12=0.03 rad or)~1.7°. This angle α can be achieved by shifting the fast axis collimators 816a, 816c by 9.6 μm (320 μm×0.03 rad) from the optical axes 806a, 806c without substantially affecting fast axis beam collimation, or by rotating the fast axis collimators 816a, 816c by 1.7° with respect to the laser diode optical axes 806a, 806c. To inhibit the continued propagation at the angle ±α for the laser diode beams 820a, 820c after reflection by the turning mirrors 824a, 824c, the turning mirror 824a is rotated forward/downward with respect to its mirror surface by a small amount (α/2) to steer the laser diode beam 820a to propagate parallel to laser diode beam 820b, and the turning mirror 824c is rotated backward/upward with respect to its mirror surface by a similar amount to steer the laser diode beam 820c to propagate parallel to laser diode beam 820b. The resulting reflected beams propagate parallel to each other with a vertical separation of 0.35 mm as a beam stack 826, shown in cross-section in angle space in FIG. 8B. As seen in FIG. 8B, the steering of the laser diode beams 820a, 820c to become parallel with the laser diode beam 820b provided by the turning mirrors 824a, 824c provides the laser diode beams 820a, 820c with a small twist rotation of about α relative to the laser diode beam 820b. The twist rotation can cause additional optical power loss due to beam clipping on turning mirrors, such as the beam 820a clipping on the turning mirror 824b after reflection off the turning mirror 824a. Simulation results indicate approximately 0.5% loss for the specific numerical example discussed above. In some examples, such losses may be acceptable. The twist rotation can also produce a rotation of a polarization axis, which can result in power loss (such as about 0.1% in the numerical example above) during polarization multiplexing arrangements and polarization multiplexed laser diode packages (such as polarization combining beams from one supercarrier with beams from another supercarrier).

In the representative example of the multi-angle fast-axis beam steering apparatus 800, one beam was unsteered and two other beams were steered by ±α relative to the unsteered beam. However, it will be appreciated that a variety of steering arrangements can be provided, including one beam unsteered and a second beam steered by an angle α, two or more beams steered at selected angles with no unsteered beams, two or more beams steered to one side of an unsteered plane, two or more beams steered unsymmetrically about an unsteered plane, etc. In some examples, a larger steering angle is provided with a fast axis collimator for at least one of the laser diode beams, such as with steering arrangements of four or more beams. The corresponding twist-rotation for beams steered to larger angles becomes larger in the afocal plane of the beams after turning. Consequently, power loss associated with the twist rotation, such as that caused by beam clipping on adjacent turning mirrors or polarization axis change, can increase and become more significant in laser diode package performance.

Figure 9A:
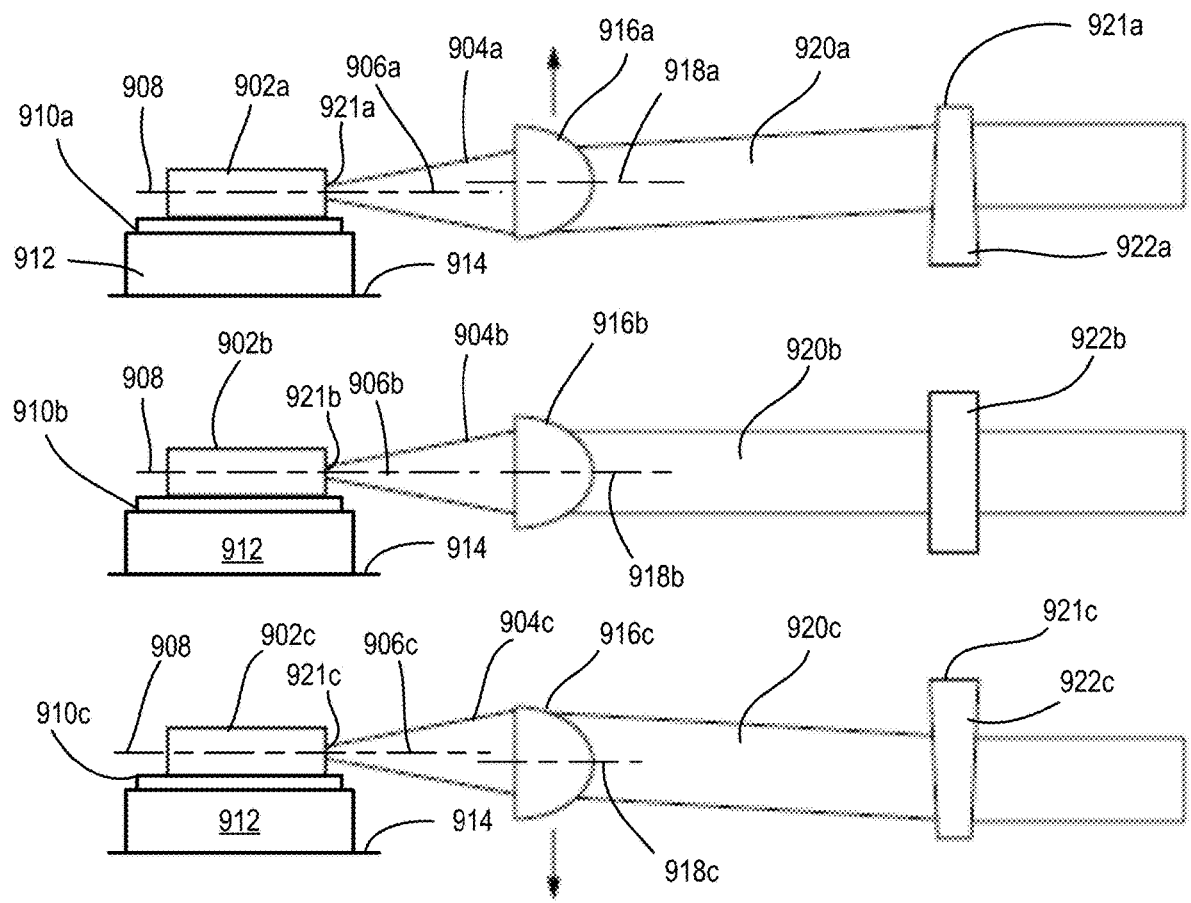
FIG. 9A is a side view of a another example fast axis collimator beam steering apparatus.
Figure 9B:
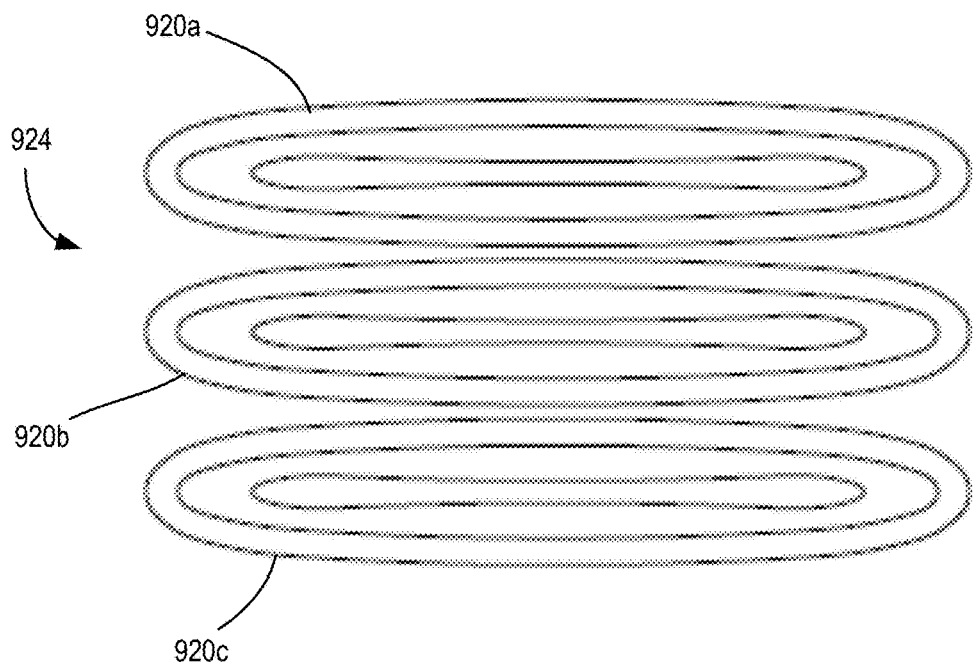
FIG. 9B is a beam cross-section in NA space for the beams in an afocal plane of the fast axis collimator beam steering apparatus shown in FIG. 9A.

An example fast axis steering apparatus 900 shown in FIGS. 9A-9B can produce an absence of twist rotation. The fast axis steering apparatus 900 includes a plurality of laser diodes 902a-902c arranged to emit respective laser diode beams 904a-904c with optical axes 906a-906c and slow axes situated in a common plane 908. The laser diodes 902a-902c can be mounted on respective submounts 910a-910c that are mounted to a common supercarrier mounting block 912. The supercarrier 912 is mounted to a housing surface 914 of the fast-axis beam steering apparatus 900. The laser diodes 902a-902c are situated adjacently into the plane of FIG. 9A, but are shown separately in a vertical direction for convenience of illustration, breaking up the common plane 908. The laser diode beams 904a, 904c are redirected with fast axis collimators 916a, 916c having offset optical axes 918a, 918c, and the laser diode beam 904b is unsteered with collinear optical axis 918b, so as to form refracted and collimated laser diode beams 920a-920c. While offset fast axis collimators 916a, 916c with translated optical axes 918a, 918c are shown, in accordance with principles described for other embodiments herein, some examples can have the fast axis collimators 916a, 916c arranged with the optical axes 918a, 918c at angles with respect to the optical axes 906a, 906c, which can reduce optical aberrations introduced into the redirected beams 920a, 920c by the redirection relative to examples using translation alone. In particular examples, a further reduction in aberration is obtained by arranging the fast axis collimators 916a, 916c with a rotation and translation such that the focal point along the optical axes 918a, 918c lies at or intersects the respective optical axes 906a, 906c at the exit facets 921a, 921c of the laser diodes 902a, 902c.

Tilting of turning mirrors (not shown) can be omitted with wedge prisms 921a, 921c that are configured to redirect the laser diode beams 920a, 920c to propagate parallel to the laser diode beam 920b. In some examples the wedge prisms 921a, 921c can be wedged slow axis collimators 922a, 922c, and a slow axis collimator 922b can be situated to slow axis collimate the laser diode beam 920b. Thus, in some examples, wedge prisms can be used to change beam direction and separate slow axis collimators can be used to slow axis collimate beams, and in other examples, slow axis collimators can provide both slow axis collimation and beam redirection. In a particular example in which the laser diode beams 904a-904c are offset from each other by 0.35 mm after reaching slow axis collimators 10 mm from emitting facets of the respective laser diodes 902a-902c, the slow axis collimators 922a, 922c (or wedged prisms 921a, 921c) are configured to provide a rotation of 0.035 rad (0.35 mm/10 mm), and the respective fast axis collimators 916a, 916c are shifted by 11.2 μm with respect to the respective optical axes 906a, 906c. In selected examples, a wedge angle of 2.6° (0.046 rad) can be used for the wedged shape of the slow axis collimators 922a, 922c or wedged prisms 921a, 921c to steer the laser diode beams 920a, 920c to propagate parallel to the laser diode beam 920b. A propagating beam stack 924 is shown in FIG. 9B after reflection by turning mirrors. As shown in an afocal plane, the offset laser diode beams 920a-920c lacks a beam twist rotation relative to each other, thereby reducing a power penalty associated with clipping or polarization. As with previous examples, arrangements of two laser diode, three diodes, four diodes, five diodes, six, nine, twelve, fifteen, etc., can be arranged in a common plane with selected fast axis steering provided with fast axis collimators, typically with the quantity of laser beams that can form a stack limited based on the ability of the fast axis collimators 916a-916c to steer the beams before beam clipping occurs on the fast axis collimators 916a-916c.

Figure 10:
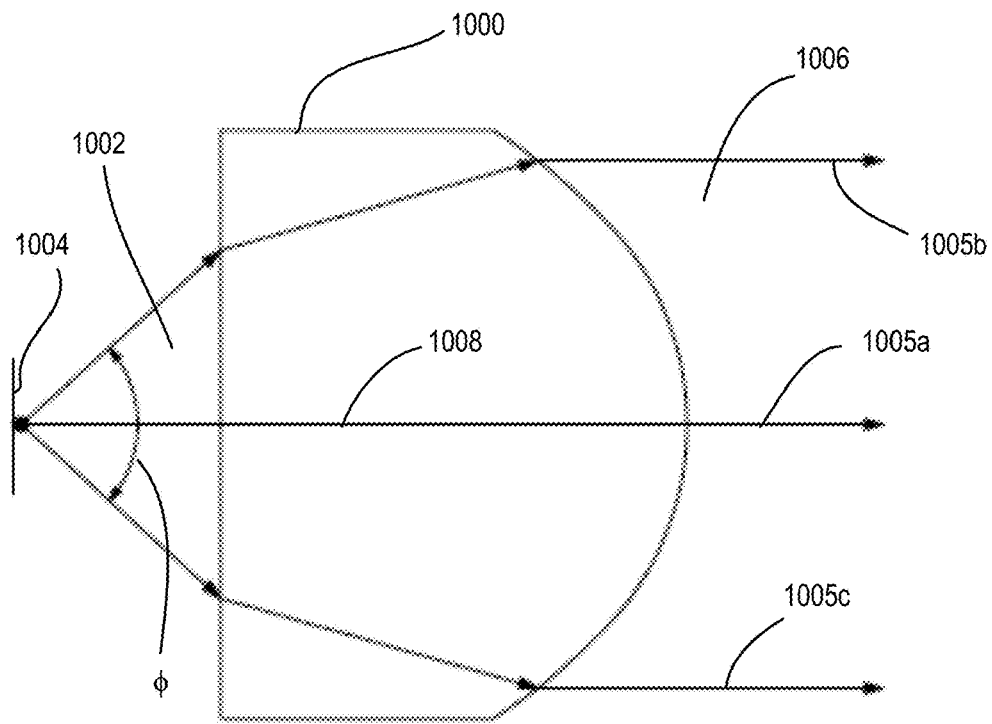
FIG. 10 is a side view of a beam collimated with a fast axis collimator.
Figure 11:
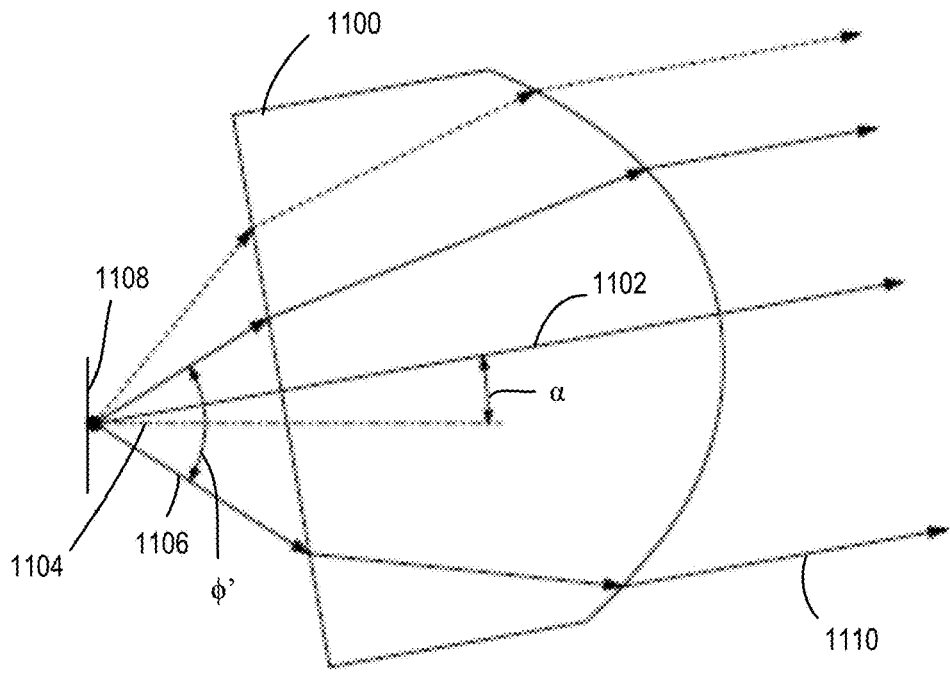
FIG. 11 is a side view of a beam collimated and steered with a fast axis collimator.

FIG. 10 shows an example fast axis collimator 1000 situated to receive a laser diode beam 1002 emitted from a laser diode facet 1004 with a center ray 1005a and two marginal rays 1005b, 1005c. The fast axis collimator 1000 collimates the laser diode beam 1002 along a fast axis to produce a fast axis collimated beam 1006. The horizontal emission plane of the laser diode beam 1002 is common with an optical axis 1008 of the fast axis collimator 1000. The fast axis collimator 1000 is typically a plano-convex (or bi-convex) cylindrical lens that provides collimation with respect to the fast axis, providing an acceptance angle $\phi_A$ and with minimum aberration. In general, a fast axis divergence angle $\theta_D$ of the laser diode beam 1002 is less than or equal to the $\phi_A$ to avoid power loss in the fast axis collimated beam 1006 or to avoid significant distortion of beam shape. FIG. 11 shows an example that can provide laser diode beam steering with a fast axis collimator 1100. An angle of α is provided between an optical axis 1102 of the fast axis collimator 1100 and an optical axis 1104 of a laser diode beam 1106 emitted from a laser diode exit facet 1108. A fast axis collimated beam 1110 is rotated by an angle α (or substantially α) from the optical axis 1104 and associated horizontal plane of slow axis emission. For simplicity of explanation, FIGS. 10-12 refer to the rotation angle α to be the same as the angle of redirection, though it will be appreciated that the angles may be very close though not identical. In representative examples, the collimation and aberration of the fast axis collimated beam 1110 is identical or close to identical to a parallel collimation as shown in FIG. 10, but at a smaller effective acceptance angle $\phi_A'$ due to the angle α and the symmetric fast axis divergence about the optical axis 1104. That is, steering the laser diode beam 1106 at the angle α out of plane through rotation of the fast axis collimator 1100 relative to the optical axis 1104 (typically with a rotation center at the exit facet 1108) leads to the reduced effective field of view $\phi_A'$: $\phi_A' = \phi_A - 2\times\alpha$. With the fast axis divergence angle $\theta_D$ required to be less than or equal to the reduced $\phi_A'$ to avoid power loss, an upper limit on the angle α of beam redirection can also be determined.

Figure 12:
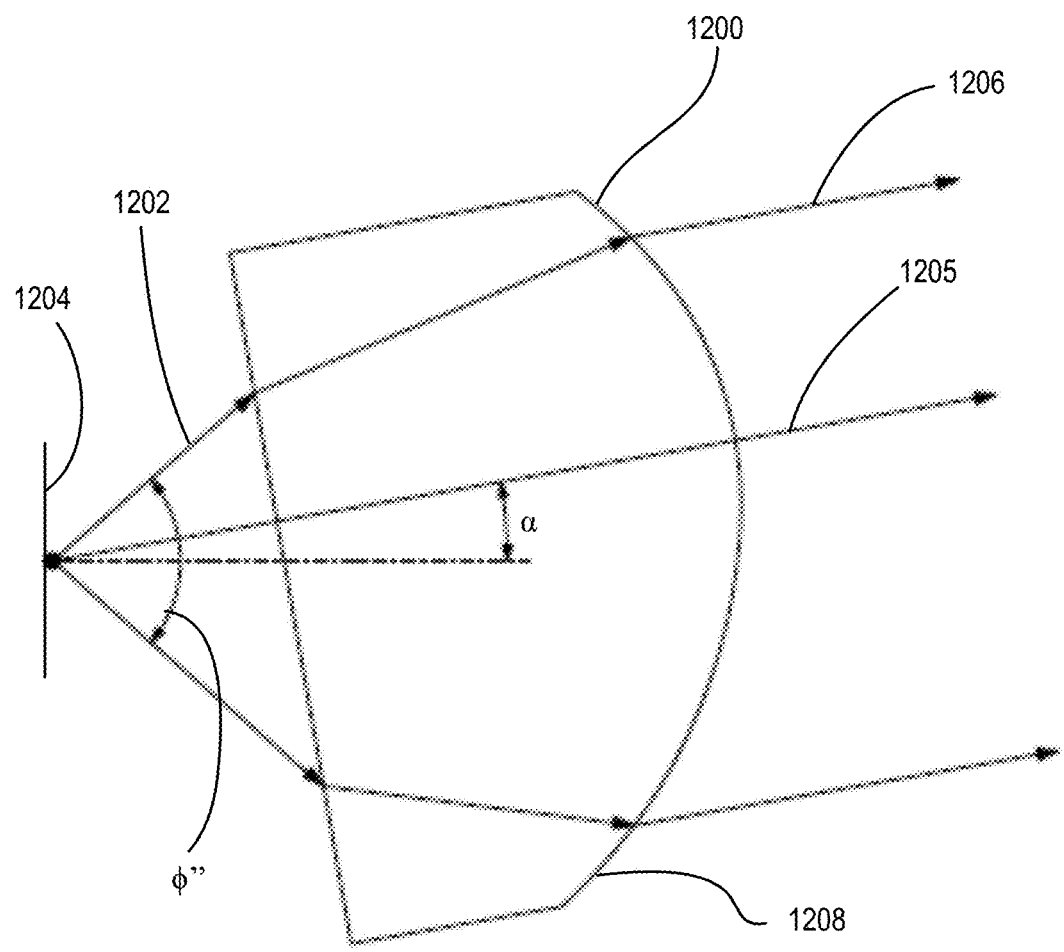
FIG. 12 is a side view of another beam collimated and steered with a fast axis collimator.

FIG. 12 shows an example fast axis collimator 1200 that can provide a larger acceptance angle $\phi_A''$ for steering a laser diode beam 1202 to an angle α after emission from a laser diode facet 1204. In representative examples, an optical axis 1205 and focal point of the fast axis collimator 1200 intersects the emitted beam 1202 at the laser diode facet 1204. To produce a fast axis collimated beam 1206, a convex surface 1208 can be configured to reduce spherical and coma aberration and to provide the larger acceptance angle $\phi_A''$ in the fast axis than the acceptance angle $\phi_A'$ of the fast axis collimator 1100, such as by truncating and/or extending surfaces or removing unused optical volume of the fast axis collimator 1200. Thus, in selected examples, the fast axis collimator 1200 can be asymmetrically configured to extend an acceptance angle on one side of the optical axis 1205 and/or reduce an acceptance angle on another side of the optical axis 1205. In some examples herein, beams emitted in a common plane become stacked one above the other in a fast axis direction with a selected vertical spacing based on the fast axis collimator redirection and turning mirrors situated at a selected distance from laser diode facets.

In various examples herein, turn mirrors can be configured to have different heights to allow beams to propagate without clipping or with reduced clipping. In further examples, turning mirrors can be placed on stair steps which can also allow identical mirror heights on the different stair steps.

Figure 13A:
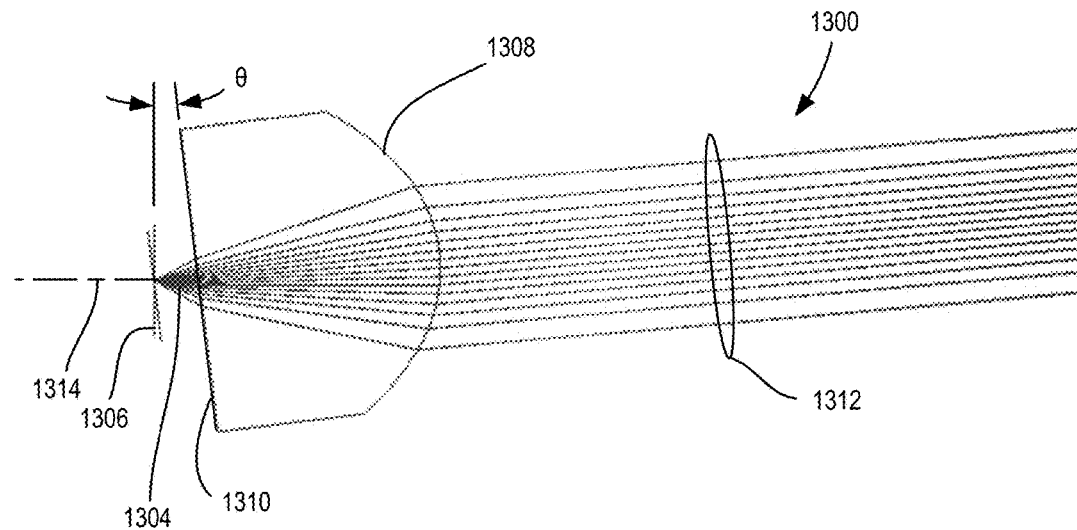
FIGS. 13A-13B are a ray trace and related transverse ray fan plots for an example fast axis collimation simulation.
Figure 13B:
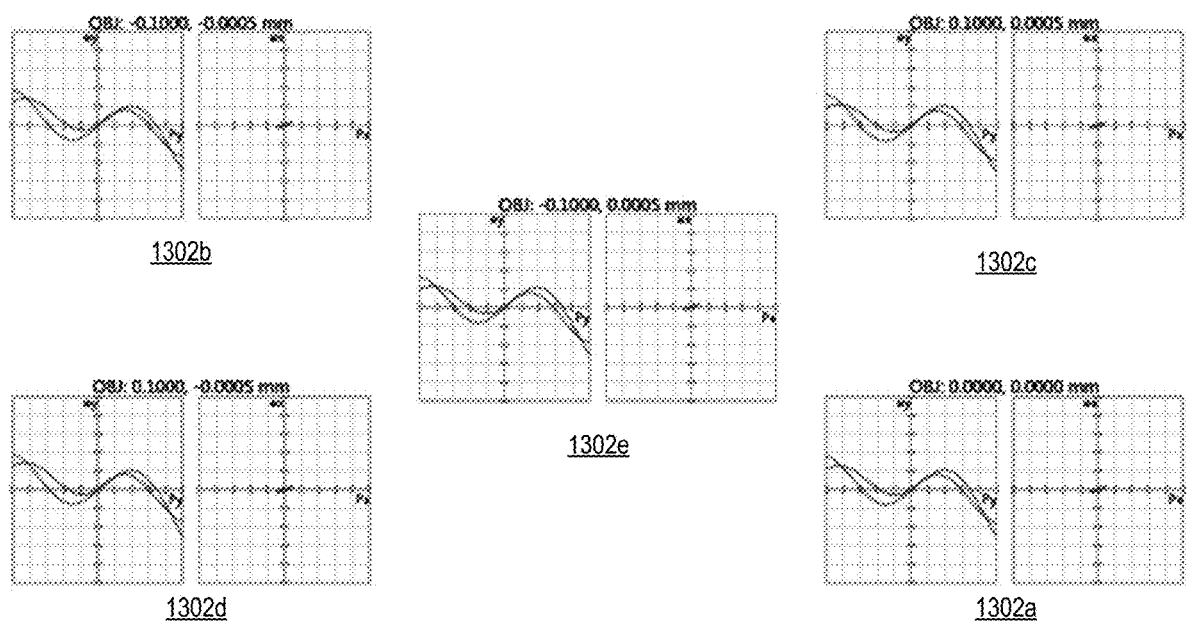

FIGS. 13A-13B show a ray trace 1300 and transverse ray fan plots 1302a-1302e for a laser diode beam 1304 emitted from an exit facet 1306 of a laser diode and redirected with a fast axis collimator 1308. A back surface 1310 of the fast axis collimator 1308 is perpendicular to an optical axis of the fast axis collimator 1308 and was arranged at an angle θ (e.g., 5°) with respect to the exit facet 1306 to produce a collimated beam 1312 that is redirected at substantially the same angle with respect to an emission axis 1314 of the laser diode beam 1304 (e.g., within 10%, 5%, 2%, 1%, or less than 1%). In some examples, the angle θ is between 3° and 6°. As can be seen from the transverse ray fan plots 1302a, optical aberrations at an image plane that are associated with a center on-axis position at the exit facet (0, 0) do not substantially differ from optical aberrations (transverse ray fan plots 1302b-1302e) associated with other more peripheral positions at the exit facet (±0.5 μm fast axis, ±100 μm slow axis).

Figure 14:
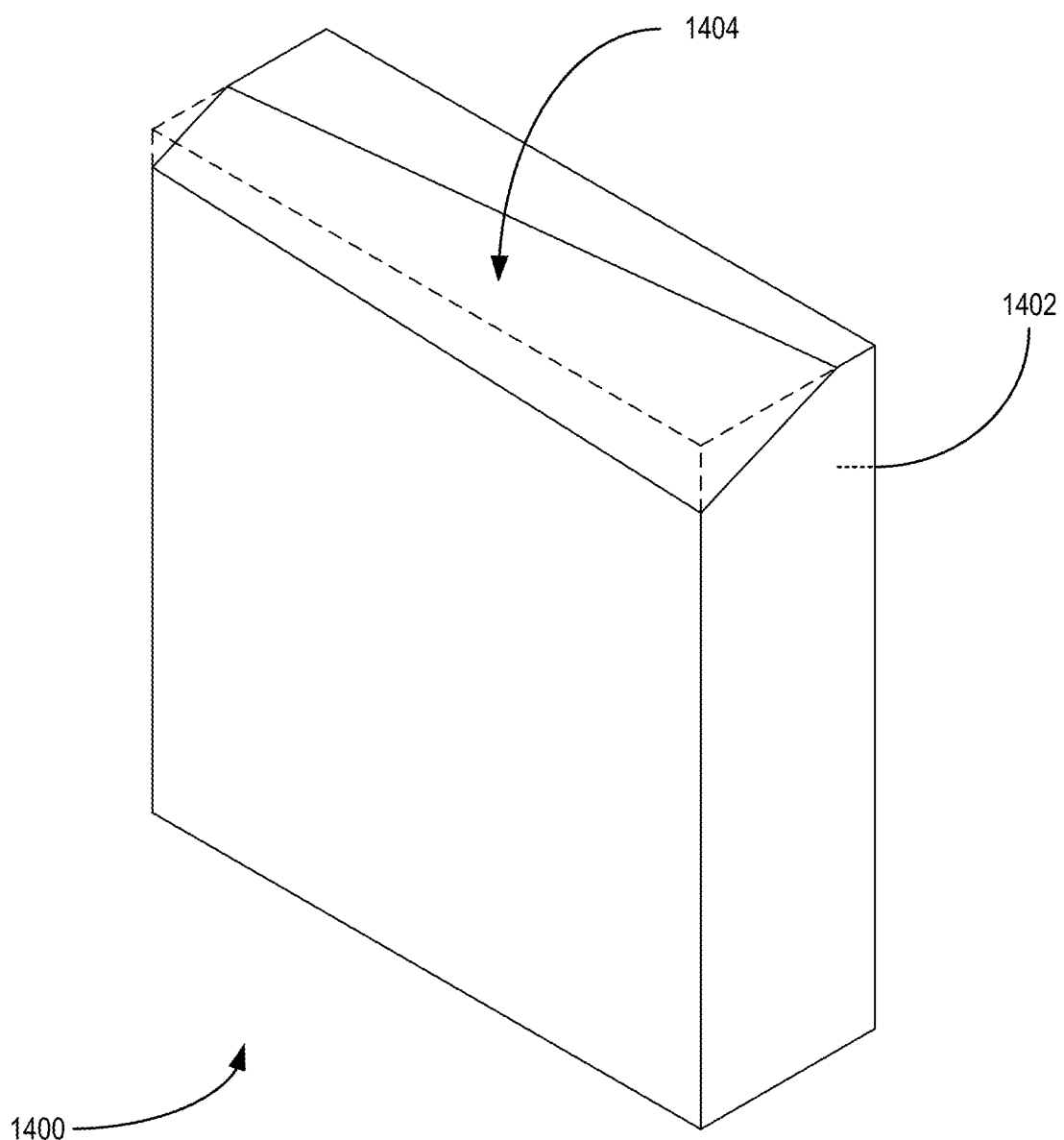
FIG. 14 is a perspective view of a example chamfered turning mirror.

FIG. 14 shows a turning mirror 1400 that can be used in various examples herein, including particular examples where beams are redirected by fast axis collimators, and the redirected beams continue to propagate along redirected axes before and after turning by turn mirrors. In representative examples, beams are emitted in a parallel direction with slow axes in a common plane, and fast axis collimators are configured to redirect the beams at a small angle with respect to the common plane. Turning mirrors receive the redirected beams and turn the beams to form a beam stack. The turning mirrors are typically adjacently arranged and spaced apart such that a first mirror does not clip or substantially clip a beam turned by an adjacent mirror that propagates over the first mirror. The turning mirror 1400 includes a receiving reflective surface 1402 that reflects an incident beam to turn the beam in a stack direction. The turning mirror 1400 also includes a chamfered portion 1404 where material of the turning mirror 1400 is removed or the turning mirror 1400 is formed so as not to be in a regular rectangular parallelepiped, so as to reduce optical clipping of a beam that is propagating over the turning mirror 1400. The chamfer and associated clipping reduction can allow additional beams to be stacked, the use of smaller redirection angles, additional error margin in manufacturing, etc. Various angles and surface characteristics of the chamfered portion 1404 can be adjusted and tailored to the particular beam stacking configuration, laser diode characteristics, and optical layout. In particular examples, the chamfered portion 1404 can correspond to a bevel extending to the receiving reflective surface 1402. In some examples, turn mirrors that provide small angle beam redirection can also include chamfered portions.

Figure 15:
FIGS. 15-16 are perspective views of thermal simulations.
Figure 16:
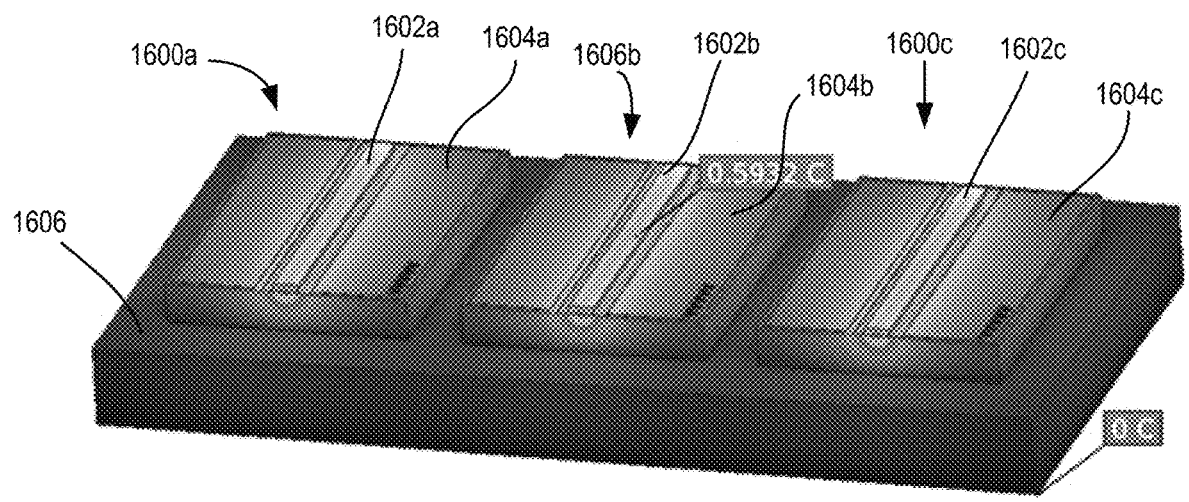

FIGS. 15-16 are thermal simulations results for chip-on-submounts 1500, 1600a-1600c. The chip-on-submount 1500 includes a laser diode 1502 coupled to a submount 1504, and that is producing heat during a simulated operation. A temperature rise of 0.45 C is observed through the submount with a 1 W input and 0° C. base temperature of the submount 1504. The chip-on-submounts 1600a-1600c includes respective laser diodes 1602a-1602c coupled to respective submounts 1604a-1602c. The chip-on-submounts 1602a-1602c are coupled to a supercarrier or housing base 1606. In simulated operation, the laser diodes 1602a-1602c produce 1 W each. With a base of the supercarrier/housing base 1606 cooled to 0° C., a temperature rise of 0.6 C is observed through the chip-on-submounts 1602a-1602c and housing base 1606 with the 1 W input from the laser diodes 1602a-1602c. As shown, very little thermal cross-talk is observed between the laser diodes 1602a-1602c. The thermal simulations show that the ability to mount chips-on-submounts directly onto a flat heatsink surface, such as the example laser diode package shown in FIG. 5, allows efficient cooling of the laser diode junctions, reduces the junction temperature of the laser diodes, and improves laser diode performance.

Figure 17A:
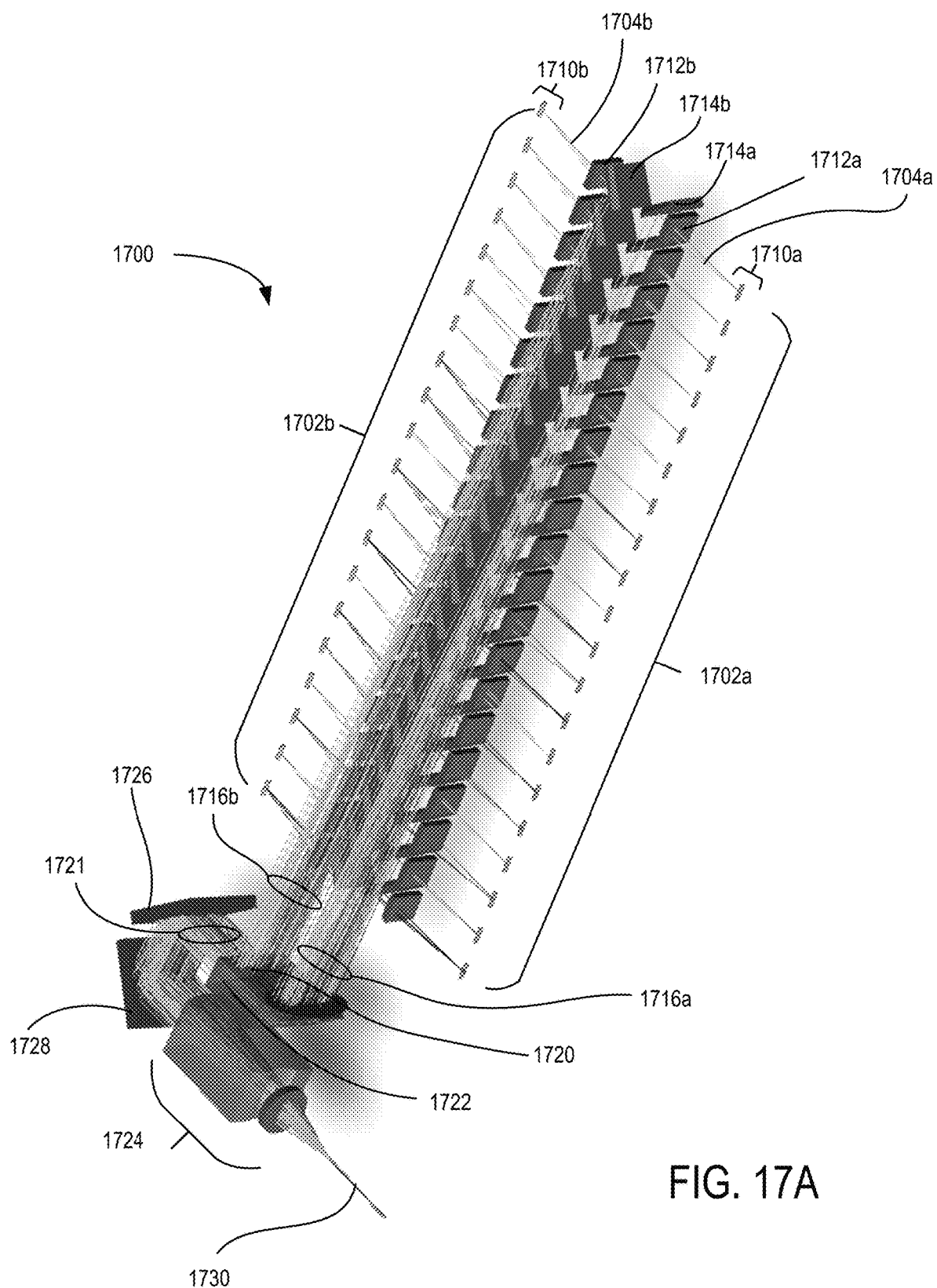

FIGS. 17A-17C depict simulated optical operation of a laser diode package configuration 1700. Two groups 1702a, 1702b of twenty laser diode emitters (omitted for clarity) emit respective groups of laser diode beams 1704a, 1704b in opposite directions towards each other. Each of the groups of laser diode beams 1704a, 1704b are emitted in respective common planes, which correspond to a single common plane 1706 in representative examples based on a parallel planar offset from a common housing mounting surface 1708 (seen more clearly in FIG. 17B). After emission into the common plane 1706 or planes, the laser diode beams 1704a, 1704b are directed at a small angle α out of the common plane 1706 with respective groups of fast axis collimators 1710a, 1710b. The laser diode beams 1704a, 1704b propagate at the small angle α through groups of slow axis collimators 1712a, 1712b and turning mirrors 1714a, 1714b. The turning mirrors 1714a, 1714b turn the groups of laser diode beams 1704a, 1704b to form respective beam stacks 1716a, 1716b. In representative examples, the turning mirrors 1714a, 1714b included a chamfered portion 1716 to provide clearance for an adjacent turned beam propagating at the small angle α. The small angle α can be more clearly seen in FIG. 17B, with selected beams 1718a-1718d emitted in propagating at the small angle α after fast axis collimation. The polarization of the beam stack 1716a is rotated with a wave plate 1720 and the beam stacks 1716a, 1716b are combined to form an output beam stack 1721 with a polarization sensitive transmissive/reflective component 1722. The output beam stack 1721 is directed to focusing optics 1724 with reflectors 1726, 1728, and the focusing optics couple the output beam stack 1721 into an optical fiber 1730.

Figure 18A:
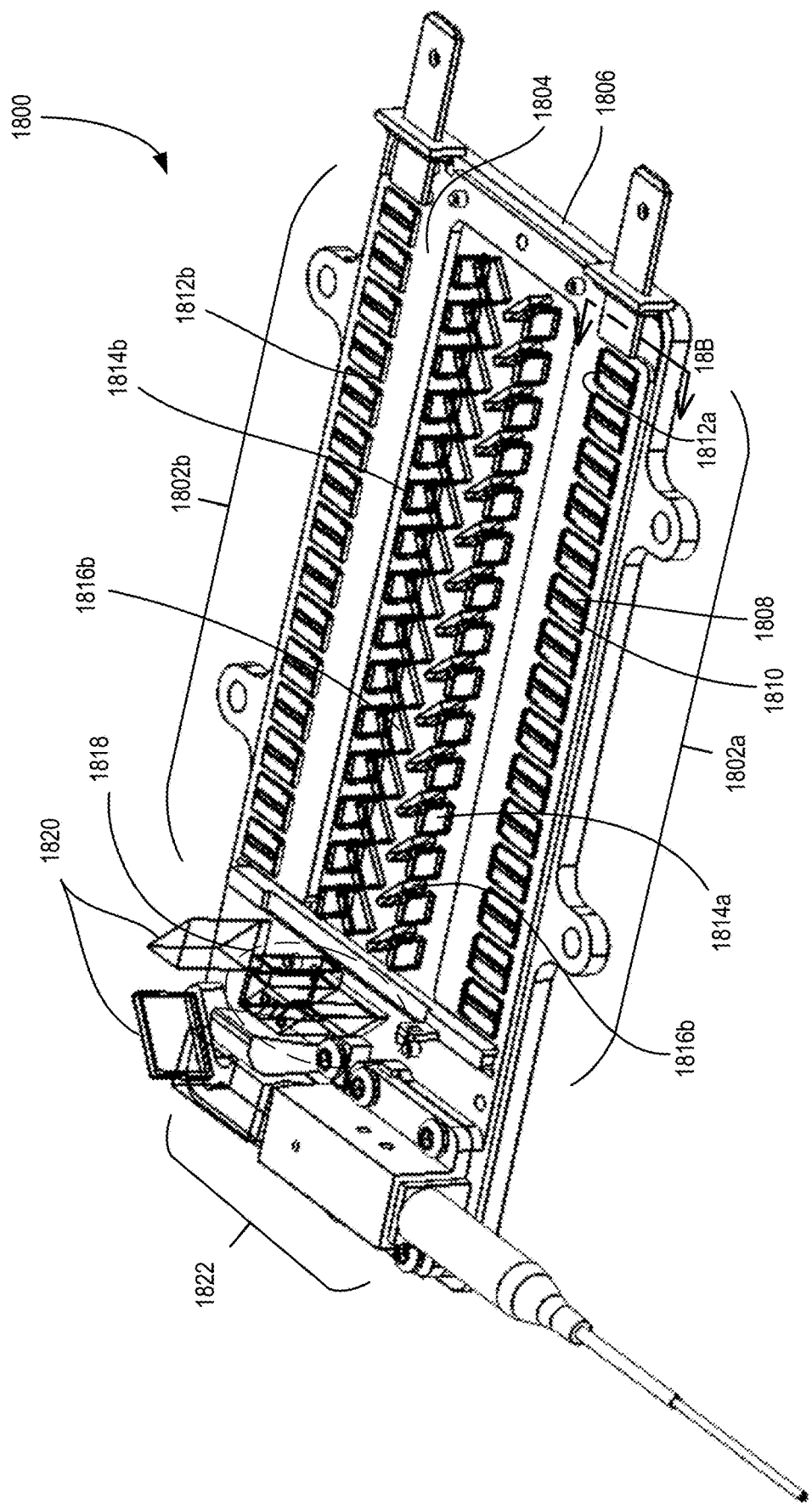
FIGS. 18A-18B are perspective views of part of an example laser diode package.
Figure 18B:
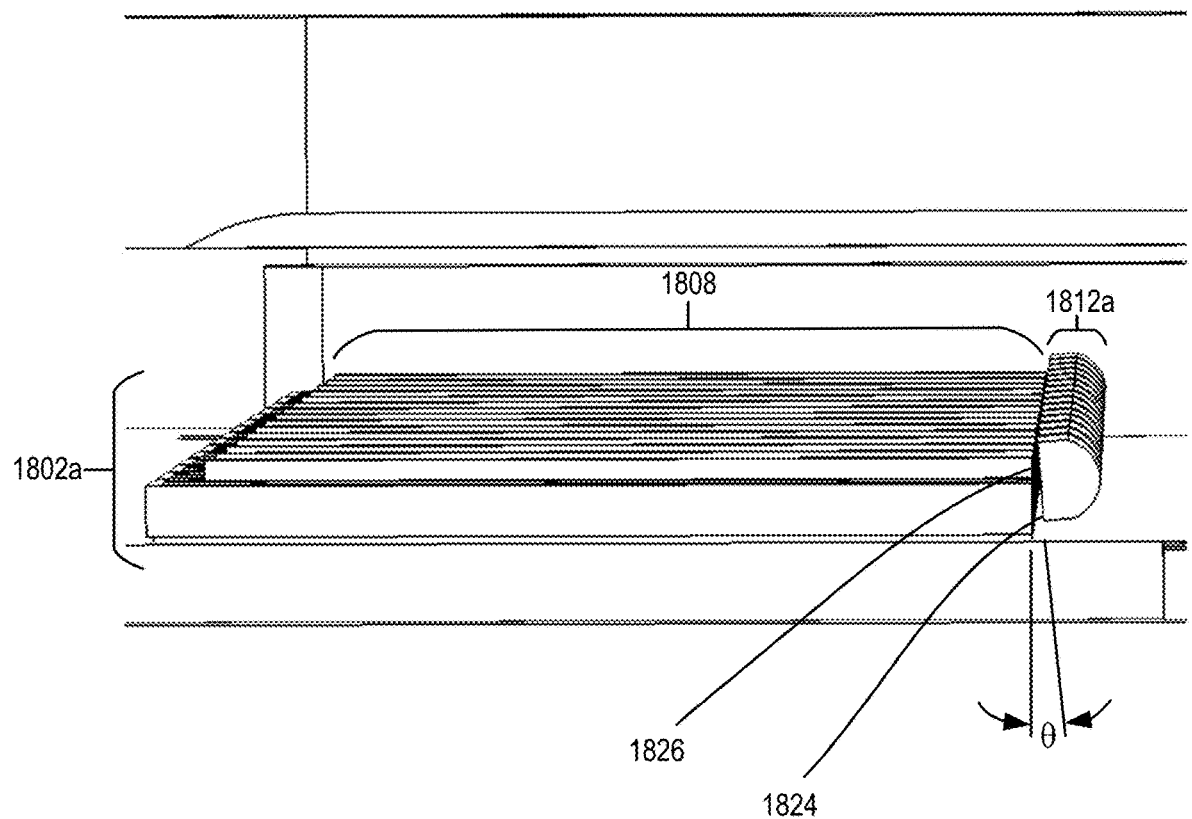

FIG. 18A shows a part of an example laser diode package 1800 including two groups of fifteen chip-on-submounts 1802a, 1802b directly attached to a surface 1804 of a housing base 1806. The chip-on-submounts 1802a, 1802b include respective laser diodes 1808 and thermally conductive submounts 1810. Fast axis collimators 1812a, 1812b collimate respective laser beams emitted by the laser diodes and direct the laser beams out of a common emission plane (that can be parallel to the surface 1804) at a small angle. The laser beams continue propagating at the small angle and are collimated by respective slow axis collimators 1814a, 1814b and turned by turning mirrors 1816a, 1816b to form respective beam stacks. The slow axis collimators 1814a, 1814b and turning mirrors 1816a, 1816b can be mounted to a different surface and/or lower height than the surface 1804. Beam propagation can be similar to that shown in FIGS. 17A-17C. Additional optical components, such as polarization multiplexing components 1818, reflectors 1820, and focusing optics 1822, can be coupled to surfaces arranged at the small angle with respect to the surface 1804 so as to provide optical surfaces perpendicular (or otherwise optically aligned) to the beam propagation direction at the small angle. FIG. 18B shows a more detailed view of the fast axis collimators 1812a adjacently situated with respect to the chip-on-submounts 1802a, including a small angle θ between flat input surfaces 1824 of the fast axis collimators 1812a and the exit facets 1826 of the laser diodes 1808. In representative examples, the angle θ is close to or substantially the same as the angle of direction of the laser beams with respect to the common emission plane (e.g., less than 10%, 5%, 2%, 1%, 0.1%, etc.). Suitable ranges for selecting small angles of redirection and/or fast axis collimator rotation can include between 1° and 5°, 3° and 6°, 5° and 10°, 10° and 15°, 1° and 15°, etc., though other ranges may be suitable as well.

Figure 19A:
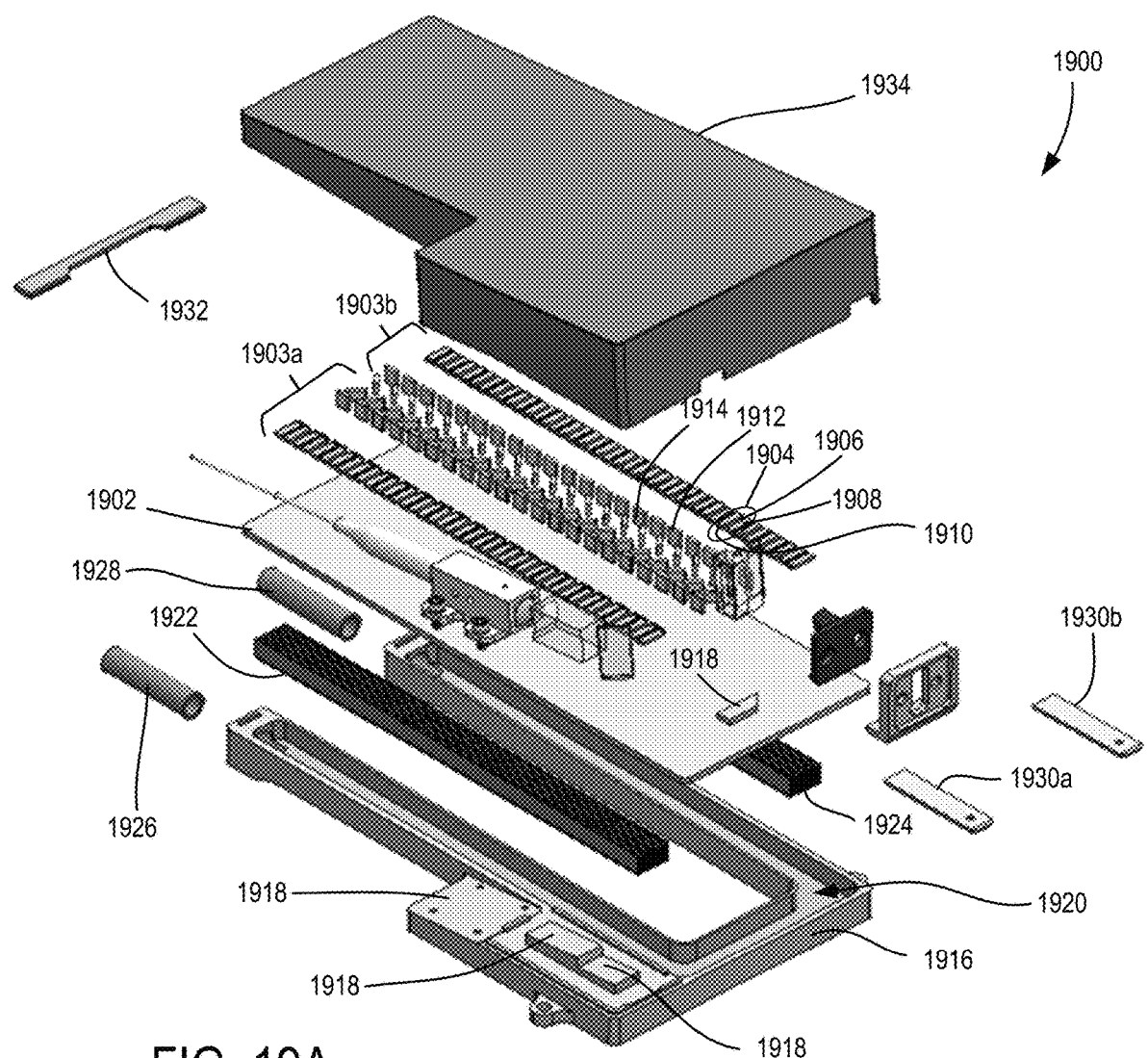
FIGS. 19A-19B are an exploded view and a side view, respectively, of another example laser diode package.
Figure 19B:
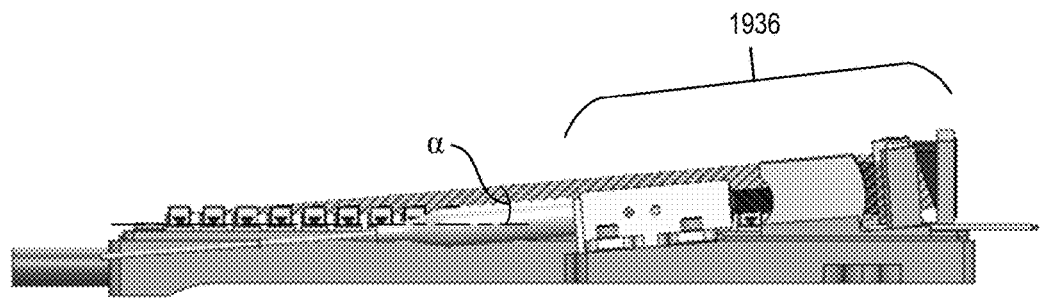

FIG. 19A shows an example laser diode package 1900 that includes a flat, relatively thin housing base 1902 on which two groups 1903a, 1903b of opposing sets of laser diode components are mounted, with each set including a chip-on-submount 1904 (each having a laser diode 1906 and submount 1908), a fast axis collimator 1910 that changes a direction of a beam as-emitted by the laser diode 1906 by a small angle α as well as collimates a fast-axis of the beam, a slow axis collimator 1912 configured to collimate a slow axis of the beam, and a turning mirror 1914 configured to change a direction of the beam to form a beam stack for the respective group of laser diode component sets. The base 1902 can be coupled to a thermal cooling block 1916, and the thermal cooling block 1916 and base 1902 can include various surfaces 1918 at small angles with respect to the base 1902 for mounting various optical components to receive the beams and/or beam stacks propagating at the small angle α provided by the fast axis collimators 1910. The thermal cooling block 1916 includes one or more cooling channels 1920 in which heat exchanging elements 1922, 1924 can be situated and through which cooling gas/fluid may be flowed. For example, fluid inlet and outlet tubes 1926, 1928 can be coupled to the cooling channel 1920 to flow coolant. Electrodes 1930a, 1930b can be positioned proximate the laser diodes 1906 to provide current for laser operation, and a conductive bar 1932 can be position to complete an electrical circuit for the laser diodes 1906 and electrodes 1930a, 1930b. A lid 1934 can be configured to enclose the two groups 1903a, 1903b and other optical components 1936 of the laser diode package 1900, and can be provided with an angled shape to correspond to the propagation of the beams at the small angle α within the volume of the laser diode package 1900.

Figure 20:
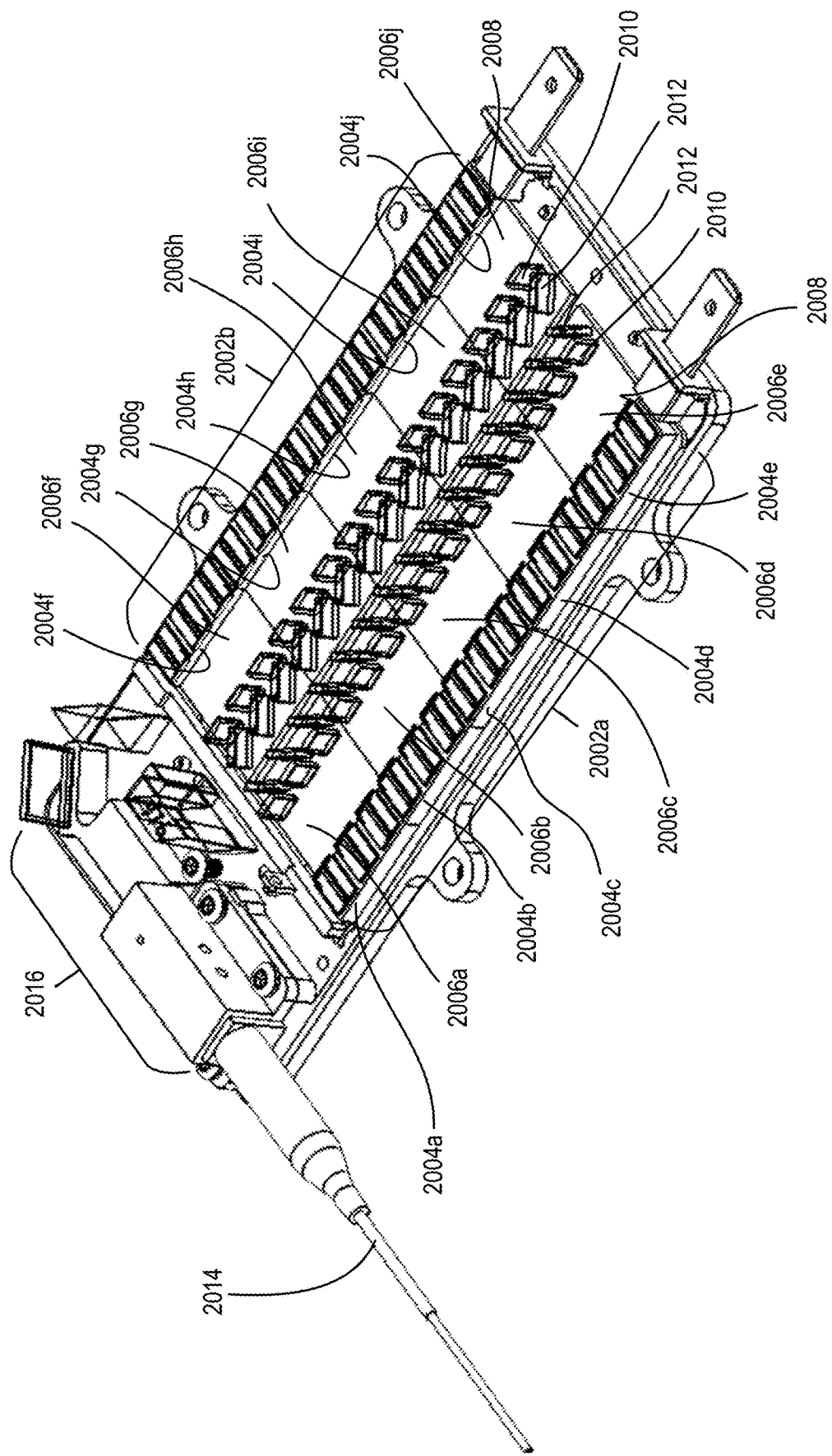
FIG. 20 is a perspective view of an other example laser diode package.

FIG. 20 shows another example part of a laser diode package 2000 similar in some respects to the part of the laser diode package 1800 shown in FIG. 18A. The laser diode package 2000 includes two groups of fifteen chip-on-submounts 2002a, 2002b. The two groups 2002a, 2002b are mounted to supercarrier mounting blocks 2004a-2004j that are mounted to respective mounting bases 2006a-2006j. Fast axis collimators 2008 are coupled to each respective laser diode to collimate the emitted beam and to direct the emitted beam slightly out of a common plane of emission for each group 2002a, 2002b. Slow axis collimators 2010 and turning mirrors 2012 can be arranged on the respective mounting bases 2006a-2006j to receive the slightly angled beams and to collimate and direct the beams to form beam stacks that are polarization multiplexed and coupled into an output optical fiber 2014 with focusing optics 2016.

General Considerations and Terminology

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections. Examples are described with reference to directions indicated as "above," "below," "upper," "lower," and the like. These terms are used for convenient description, but do not imply any particular spatial orientation.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods which function in the manner described by such theories of operation.

"Brightness" refers herein to the power of the laser diode or laser module divided by the BPP-squared.

"Downstream" is a relative term that refers herein to an item and/or process positioned farther along a light path than a reference item and/or process.

"Fast Axis" (FA) refers herein to the light emitted into the Y-Z plane of the laser diode.

"Fast Axis Collimator (FAC) Lens" refers herein to the cylinder lens used to collimate the fast axis of the laser diode.

"Light path" refers herein to the path that light takes in traversing an optical medium or system.

"Numerical Aperture" (NA) refers herein to the angle of the light incident upon a fiber, or exiting the laser diode, calculated by taking the sine of ½ the divergence or ½ the convergence. Numerical aperture space refers to a coordinate system based on numerical aperture and can be used to show the angular content of a beam with respect to one or more axes and reference planes.

"Objective Lens" refers herein to the lens or lenses used to launch the light into the optical fiber.

"Optical axis" refers herein to an imaginary line that defines the path along which light propagates through the system, up to first approximation. For a system composed of simple lenses and mirrors, an optical axis passes through the center of curvature of each surface, and coincides with the axis of rotational symmetry. For non-rotationally symmetric optical systems, each plane may be defined to have its own optical axis. Further, beams can propagate along optical axes or beam axes that can be different from optical axes of lens and mirrors to which they are coupled.

"Slow Axis" (SA) refers herein to the light emitted into the X-Z plane of the laser diode.

"Slow Axis Collimator (SAC) Lens" refers herein to a cylinder lens used to collimate the slow axis of the laser diode.

"Thermal conductivity" (TC) refers herein to the ability of a material to transfer heat across the material.

"Upstream" is a relative term that refers herein to an item and/or process positioned before another item and/or process along the light path in the direction light is traveling along the light path.

In view of the many possible embodiments to which the principles of the disclosed technology may be applied, it should be recognized that the illustrated embodiments are only preferred examples and should not be taken as limiting the scope of the disclosed technology. Rather, the scope of the disclosed technology is defined by the following claims. We therefore claim all that comes within the scope of these claims.

We claim:

1. An apparatus, comprising:
a first laser diode situated to emit a beam along an optical axis, the beam having perpendicular fast and slow axes perpendicular to the optical axis;
a first fast axis collimator (FAC) optically coupled to the beam;
a second laser diode situated to emit a beam along an optical axis;
a second fast axis collimator (FAC) optically coupled to the beam emitted from the second laser diode; and
first and second turning mirrors situated to receive the beams and to turn the beams for stacking along the fast axes;
wherein at least one of the first or second turning mirrors has a shape defined by a departure from a rectangular parallelepiped shape, wherein the departure defines a surface and volume configured to provide clearance for the beam turned by the other of the first or second turning mirrors to propagate adjacent to the surface with at least a portion propagating through the volume.

2. The apparatus of claim 1, wherein the surface comprises a chamfer.

3. The apparatus of claim 1, wherein the surface comprises a bevel.

4. The apparatus of claim 3, wherein the bevel extends to a receiving reflective surface of the at least one first or second turning mirror.

5. The apparatus of claim 1, wherein both the first and second turning mirrors comprise respective surfaces defined by respective parallelepiped subtractions.

6. The apparatus of claim 5, wherein the surfaces are differently shaped from each other.

7. The apparatus of claim 1, wherein the first FAC has an optical axis arranged at a non-zero angle with respect to the optical axis of the first laser diode to produce a redirected beam axis that is redirected at an angle greater than or equal to 2 degrees and less than or equal to 20 degrees with respect to the optical axis of the first laser diode.

8. The apparatus of claim 1, wherein the first FAC has an optical axis parallel to the optical axis of the first laser diode but spaced apart by a distance to produce a redirected beam axis.

9. A laser diode pump module comprising the apparatus of claim 1.

10. A fiber laser system, comprising one or more of the laser diode pump modules of claim 9.

11. A method, comprising:
arranging a plurality of laser diodes in a laser diode module to emit respective beams from emission facets along optical axes, wherein the beams as emitted have perpendicular fast and slow axes perpendicular to the respective parallel optical axis; and
securing at least one fast axis collimator (FAC) in relation to one of the emission facets, wherein the FAC is secured such that a FAC optical axis is at a non-zero angle with respect to the optical axis of the beam emitted from the one emission facet so that the beam is redirected along a redirected beam axis at an angle greater than or equal to 2 degrees and less than or equal to 20 degrees with respect to the FAC optical axis after transmission through the at least one FAC.

12. The method of claim 11, wherein the securing the at least one FAC in relation to one of the emission facets comprises securing the at least one FAC with a UV cured epoxy, high temperature glue, or lens bonding material.

13. The method of claim 11, wherein the securing the at least one FAC in relation to one of the emission facets comprises securing the FAC to a laser diode submount, the respective laser diode, a mounting surface of the laser diode module, and/or an intermediate securing member.

14. The method of claim 11, wherein the securing the at least one FAC in relation to one of the emission facets comprises securing the FAC such that the FAC is in contact with a laser diode submount, a respective laser diode, a mounting surface of the laser diode module, and/or an intermediate securing member.

15. The method of claim 11, further comprising securing another fast axis collimator (FAC) in relation to another of the emission facets, wherein the FAC is secured such that a FAC optical axis is at a non-zero angle with respect to the optical axis of the beam emitted from the other emission facet so that the beam is redirected along a redirected beam axis after transmission through the other FAC.

16. The method of claim 11, wherein the securing the at least one FAC in relation to one of the emission facets comprises securing the FAC such that the FAC optical axis intersects the beam optical axis at the emission facet.

17. The method of claim 11, further comprising securing one or more turning mirrors in relation to respective laser diodes to receive the beams along the respective redirected beam axes and to turn the beams to become stacked along the fast axes and to redirect the beams to propagate at a common angle.

18. The method of claim 11, wherein the arranging the plurality of laser diodes in a laser diode module to emit respective beams from emission facets along optical axes comprises arranging the optical axes in a common plane.

19. The method of claim 18, further comprising securing at least one wedge prisms situated to receive the beams along one of the respective redirected beam axes and configured to redirect the beams to propagate at a common angle with respect to the common plane.

20. An apparatus, comprising:
at least one laser diode configured to emit a beam from an exit facet along an optical axis, wherein the beam as emitted having perpendicular fast and slow axes perpendicular to the optical axis; and
means for collimating the beam along the fast axis while redirecting the beam at an angle with respect to the optical axis at least in part using a non-parallel optical axis relation and for producing a redirected collimated beam propagating in free space along a redirected beam axis that is at an angle greater than or equal to 2 degrees and less than or equal to 20 degrees with respect to the optical axis.

21. An apparatus, comprising:
a first laser diode situated to emit a beam along an optical axis, the beam having perpendicular fast and slow axes perpendicular to the optical axis;
a first fast axis collimator (FAC) optically coupled to the beam;
a second laser diode situated to emit a beam along an optical axis;
a second fast axis collimator (FAC) optically coupled to the beam emitted from the second laser diode; and
first and second turning mirrors situated to receive the beams and to turn the beams for stacking along the fast axes;
wherein at least one of the first or second turning mirrors has a shape defined by a departure from a rectangular parallelepiped shape, wherein the departure defines a surface configured to provide clearance for the beam turned by the other of the first or second turning mirrors to propagate adjacent to the surface;
wherein the first FAC has an optical axis arranged at a non-zero angle with respect to the optical axis of the first laser diode to produce a redirected beam axis that is redirected at an angle greater than or equal to 2 degrees and less than or equal to 20 degrees with respect to the optical axis of the first laser diode.

* * * * *